United States Patent
Nakajima et al.

(10) Patent No.: US 10,375,334 B2
(45) Date of Patent: *Aug. 6, 2019

(54) IMAGE SENSOR AND ELECTRONIC APPARATUS INCLUDING MULTIPLE SUBSTRATES

(71) Applicant: SONY CORPORATION, Tokyo (JP)

(72) Inventors: Tsutomu Nakajima, Tokyo (JP); Atsushi Muto, Shizuoka (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/971,460

(22) Filed: May 4, 2018

(65) Prior Publication Data

US 2018/0255260 A1    Sep. 6, 2018

Related U.S. Application Data

(63) Continuation of application No. 15/127,510, filed as application No. PCT/JP2015/060551 on Apr. 3, 2015, now Pat. No. 10,015,427.

(30) Foreign Application Priority Data

Apr. 15, 2014  (JP) .................................. 2014-083364

(51) Int. Cl.
*H04N 5/3745* (2011.01)
*H01L 27/146* (2006.01)
(Continued)

(52) U.S. Cl.
CPC ... *H04N 5/37455* (2013.01); *H01L 27/14607* (2013.01); *H01L 27/14634* (2013.01);
(Continued)

(58) Field of Classification Search
CPC .................................................. H04N 5/37455
See application file for complete search history.

(56) References Cited

U.S. PATENT DOCUMENTS

| 8,946,610 B2* | 2/2015 | Iwabuchi | H04N 5/2253 |
| | | | 250/208.1 |
| 9,866,776 B2* | 1/2018 | Nishizawa | H04N 5/378 |

(Continued)

FOREIGN PATENT DOCUMENTS

| CN | 102782840 | 11/2012 |
| CN | 102917184 | 2/2013 |

(Continued)

OTHER PUBLICATIONS

Official Action (with English translation) for Chinese Patent Application No. 201580015655.9, dated Jan. 2, 2019, 18 pages.

(Continued)

*Primary Examiner* — Cynthia Segura
(74) *Attorney, Agent, or Firm* — Sheridan Ross P.C.

(57) ABSTRACT

The present technology relates to an image sensor and an electronic apparatus which can make the image sensor a smaller without degrading performance of the image sensor. The image sensor includes a pixel array unit in which pixels including photoelectric conversion elements are arranged in a two dimensional manner, a row circuit configured to control row scanning of the pixel array unit, and a column processing unit configured to convert an analog signal read out from the pixel array unit into a digital signal. The pixel array unit is disposed on a first-layer substrate, and the row circuit and the column processing unit are disposed on different substrates which are underlying layers of the first-layer substrate and which are laminated on the first-layer substrate. The present technology is applicable to the image sensor.

13 Claims, 19 Drawing Sheets

(51) Int. Cl.
*H04N 5/376* (2011.01)
*H04N 5/374* (2011.01)
*H04N 5/369* (2011.01)

(52) U.S. Cl.
CPC ....... *H01L 27/14643* (2013.01); *H04N 5/374* (2013.01); *H04N 5/376* (2013.01); *H04N 5/379* (2018.08)

(56) References Cited

U.S. PATENT DOCUMENTS

| | | | |
|---|---|---|---|
| 10,003,759 B2* | 6/2018 | Fan | H04N 5/369 |
| 2008/0042046 A1* | 2/2008 | Mabuchi | H01L 27/14634 250/208.1 |
| 2010/0053399 A1* | 3/2010 | Nishi | H03M 1/123 348/308 |
| 2010/0176423 A1* | 7/2010 | Sugawa | H01L 27/14603 257/225 |
| 2010/0208115 A1* | 8/2010 | Sugawa | H04N 5/35527 348/308 |
| 2010/0245647 A1* | 9/2010 | Honda | H01L 27/14634 348/308 |
| 2010/0276572 A1* | 11/2010 | Iwabuchi | H01L 23/481 250/208.1 |
| 2011/0221931 A1* | 9/2011 | Wakabayashi | G01K 7/01 348/229.1 |
| 2012/0307030 A1* | 12/2012 | Blanquart | H01L 27/14601 348/76 |
| 2013/0092820 A1* | 4/2013 | Takemoto | H04N 5/369 250/208.1 |
| 2013/0256824 A1* | 10/2013 | Mizuta | H01L 27/1464 257/459 |
| 2014/0232916 A1* | 8/2014 | Nagai | H03M 1/56 348/302 |
| 2015/0014517 A1* | 1/2015 | Ikebe | H03M 1/14 250/208.1 |
| 2015/0146063 A1* | 5/2015 | Nishizawa | H04N 5/378 348/302 |
| 2015/0288908 A1* | 10/2015 | Shen | G06F 17/5072 348/308 |
| 2016/0360129 A1* | 12/2016 | Yoshida | H04N 5/3575 |
| 2017/0078603 A1* | 3/2017 | Yamasaki | H04N 5/378 |
| 2017/0366757 A1* | 12/2017 | Maruyama | H04N 5/2253 |
| 2018/0109750 A1* | 4/2018 | Sukegawa | H01L 27/14 |

FOREIGN PATENT DOCUMENTS

| | | |
|---|---|---|
| JP | 2010-225927 | 10/2010 |
| JP | 2012-054495 | 3/2012 |
| JP | 2013-051674 | 3/2013 |
| WO | WO 2011/083722 | 7/2011 |
| WO | WO 2013/041924 | 3/2013 |
| WO | WO 2013/057903 | 4/2013 |

OTHER PUBLICATIONS

Official Action (with English translation) for Japanese Patent Application No. 2016-513712, dated Jan. 8, 2019, 22 pages.

* cited by examiner

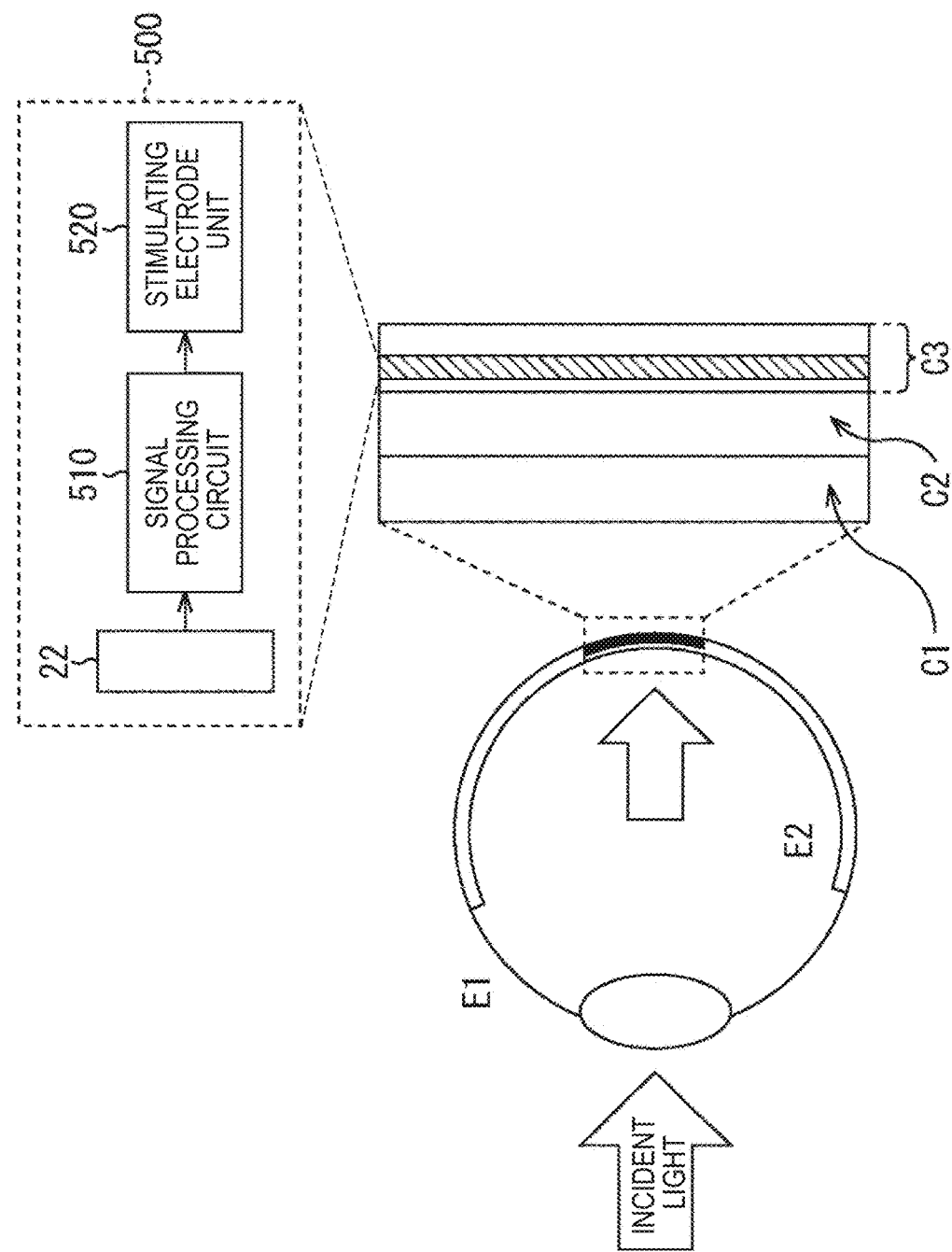

IMAGE SENSOR AND ELECTRONIC APPARATUS INCLUDING MULTIPLE SUBSTRATES

CROSS REFERENCE TO RELATED APPLICATIONS

This application is a continuation of U.S. patent application Ser. No. 15/127,510, filed Sep. 20, 2016, which is a national stage application under 35 U.S.C. 371 and claims the benefit of PCT Application No. PCT/JP2015/060551 having an international filing date of 3 Apr. 2015, which designated the United States, which PCT application claimed the benefit of Japanese Patent Application No. 2014-083364 filed 15 Apr. 2014, the disclosures of which are incorporated herein by reference in their entirety.

TECHNICAL FIELD

The present technology relates to an image sensor and an electronic apparatus, more particularly, to an image sensor and an electronic apparatus which are suitable for being applied to realize a smaller size.

BACKGROUND ART

In related art, an imaging device, such as a digital camera and a digital video camera, which records a shot image using an image sensor has been developed. The image sensor has a pixel unit and a peripheral circuit unit. The peripheral circuit unit reads out a signal from a pixel and outputs the signal as an image signal. The pixel unit performs photoelectric conversion using a photodiode, and a signal obtained through photoelectric conversion is read out to the peripheral circuit unit through a pixel circuit formed in the pixel unit.

In recent years, while it is desired to make such an imaging device have more pixels, higher image quality and higher speed, it is also desired to make the imaging device further smaller. As an imaging device which satisfies such desires, a laminate type imaging device is proposed. The laminate type imaging device has a structure in which a chip on which a signal processing circuit is formed is used in place of a support substrate of the imaging device, and a pixel portion is superimposed thereon. It is proposed to make the imaging device smaller by employing such a structure (see, for example, Patent Literature 1 to Patent Literature 3).

CITATION LIST

Patent Literature

Patent Literature 1: JP 2013-051674A
Patent Literature 2: JP 2011-204915A
Patent Literature 3: JP 2011-159958A

SUMMARY OF INVENTION

Technical Problem

Even when an imaging device has a laminate structure in which a pixel circuit and a peripheral circuit portion are disposed on a plurality of substrates, it is desired to form an image region and a logic circuit which performs signal processing so as to be able to sufficiently exert respective performance, while achieving higher performance and a smaller size.

The present technology has been made in view of such circumstances, and is directed to making an image sensor further smaller.

Solution to Problem

A first image sensor according to one aspect of the present technology includes: a pixel array unit in which pixels including photoelectric conversion elements are arranged in a two dimensional manner; a row circuit configured to control row scanning of the pixel array unit; and a column processing unit configured to convert an analog signal read out from the pixel array unit into a digital signal. The pixel array unit is disposed on a first-layer substrate, and the row circuit and the column processing unit are disposed on different substrates which are underlying layers of the first-layer substrate and which are laminated on the first-layer substrate.

A length of the row circuit in a vertical direction can be equal to or longer than a length of the pixel array unit in a vertical direction.

A length of the column processing unit in a horizontal direction can be equal to or longer than a length of the pixel array unit in a horizontal direction.

When a first substrate on which the pixel array unit is disposed and a second substrate on which the row circuit is disposed are laminated, the row circuit can be disposed on the second substrate such that a central axis of the pixel array unit in a horizontal direction is displaced from a central axis of the row circuit in a horizontal direction.

When a first substrate on which the pixel array unit is disposed and a second substrate on which the column processing unit is disposed are laminated, the column processing unit can be disposed on the second substrate such that a central axis of the pixel array unit in a vertical direction is displaced from a central axis of the column processing unit in a vertical direction.

A memory can be disposed on the same substrate as a substrate of the row circuit or the column processing unit.

A first electronic apparatus according to one aspect of the present technology includes: an image sensor including a pixel array unit in which pixels including photoelectric conversion elements are arranged in a two dimensional manner, a row circuit configured to control row scanning of the pixel array unit, and a column processing unit configured to convert an analog signal read out from the pixel array unit into a digital signal, in which the pixel array unit is disposed on a first-layer substrate, and the row circuit and the column processing unit are disposed on different substrates which are underlying layers of the first-layer substrate and which are laminated on the first-layer substrate; and a signal processing unit configured to perform signal processing on a signal output from the image sensor.

In the first image sensor according to one aspect of the present technology, a pixel array unit in which pixels including photoelectric conversion elements are arranged in a two dimensional manner; a row circuit configured to control row scanning of the pixel array unit; and a column processing unit configured to convert an analog signal read out from the pixel array unit into a digital signal are included. The pixel array unit is disposed on a first-layer substrate, and the row circuit and the column processing unit are disposed on different substrates which are underlying layers of the first-layer substrate and which are laminated on the first-layer substrate.

The first electronic apparatus according to one aspect of the present technology includes the first image sensor.

A second image sensor according to one aspect of the present technology includes: a pixel array unit in which pixels including photoelectric conversion elements are arranged in a two dimensional manner. The pixel array unit is disposed on a first-layer substrate, and a circuit which processes an analog signal and a circuit which processes a digital signal among a circuit which controls the pixel array unit and a circuit which processes a signal from the pixel array unit, are disposed on different substrates which are underlying layers of the first-layer substrate and which are laminated on the first-layer substrate.

Among a column processing unit which converts an analog signal read out from the pixel array unit into a digital signal, the circuit which processes the analog signal and the circuit which processes the digital signal can be disposed on the different substrates.

On the first-layer substrate and a plurality of substrates which are underlying layers of the first-layer substrate, circuits configured with only low breakdown voltage transistors or high breakdown voltage transistors can be disposed.

A second electronic apparatus according to one aspect of the present technology includes: an image sensor including a pixel array unit in which pixels including photoelectric conversion elements are arranged in a two dimensional manner, in which the pixel array unit is disposed on a first-layer substrate, and a circuit which processes an analog signal and a circuit which processes a digital signal among a circuit which controls the pixel array unit and a circuit which processes a signal from the pixel array unit, are disposed on different substrates which are underlying layers of the first-layer substrate and which are laminated on the first-layer substrate; and a signal processing unit configured to perform signal processing on a signal output from the image sensor.

In the second image sensor according to one aspect of the present technology, a pixel array unit in which pixels including photoelectric conversion elements are arranged in a two dimensional manner is included. The pixel array unit is disposed on a first-layer substrate, and a circuit which processes an analog signal and a circuit which processes a digital signal among a circuit which controls the pixel array unit and a circuit which processes a signal from the pixel array unit, are disposed on different substrates which are underlying layers of the first-layer substrate and which are laminated on the first-layer substrate.

A second electronic apparatus according to one aspect of the present technology is configured to include the second image sensor.

Advantageous Effects of Invention

According to one aspect of the present technology, it is possible to make an image sensor further smaller.

Note that the effects described here are not necessarily limited, and any effect that is desired to be described in the present disclosure may be exhibited.

BRIEF DESCRIPTION OF DRAWINGS

FIG. 19 is a diagram for explaining an application example of a device to which the present technology is to be applied.

DESCRIPTION OF EMBODIMENT(S)

An embodiment for implementing the present technology (hereinafter, referred to as an embodiment) will be described below. Note that description will be provided in the following order.
1. Configuration of imaging device
2. Configuration of image sensor
3. Circuit arrangement when image sensor is configured with a plurality of layers
4. Flow of signals and circuit arrangement
5. Application example <Configuration of Imaging Apparatus>

The present technology described below can be applied to a general electronic apparatus such as an imaging device such as a digital still camera and a video camera, a mobile terminal device such as a mobile phone, having an imaging function, and a copier in which an image sensor is used as an image reading unit.

Figure 1:
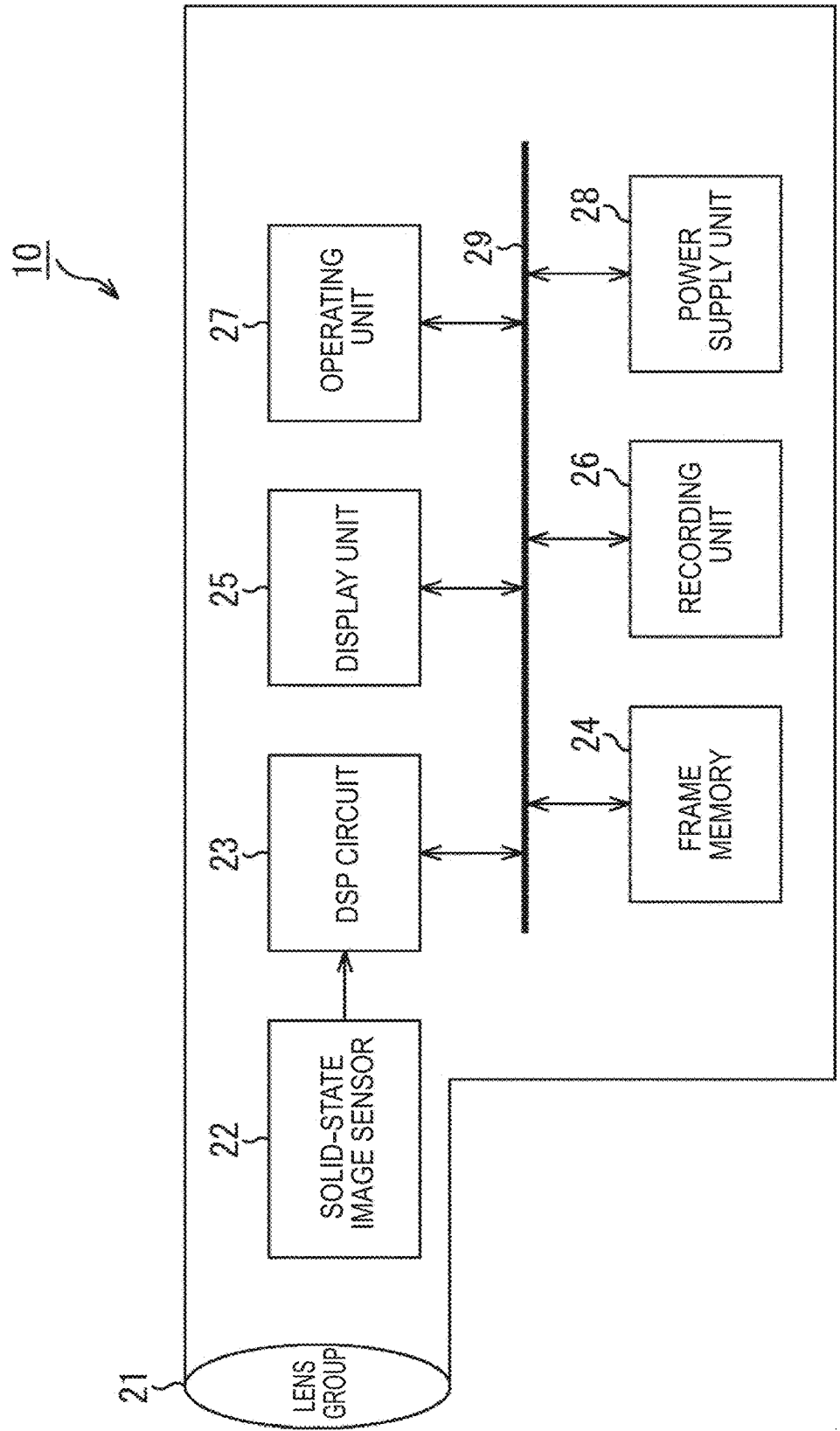
FIG. 1 is a diagram illustrating a configuration of an imaging device.

FIG. 1 is a block diagram illustrating an example of a configuration of an electronic apparatus, for example, an imaging device according to the present technology. As illustrated in FIG. 1, the imaging device 10 according to the present technology has an optical system including a lens group 21, or the like, a solid-state image sensor (imaging device) 22, a digital signal processor (DSP) circuit 23, a frame memory 24, a display unit 25, a recording unit 26, an operating unit 27, a power supply unit 28, or the like. The DSP circuit 23, the frame memory 24, the display unit 25, the recording unit 26, the operating unit 27 and the power supply unit 28 are connected to one another via a bus line 29.

The lens group 21 takes in incident light (image light) from a subject to form an image of the incident light on an imaging surface of the solid-state image sensor 22. The solid-state image sensor 22 converts a light amount of the incident light formed on the imaging surface by the lens group 21 into an electrical signal and outputs the electrical signal as a pixel signal.

The DSP circuit 23 processes the signal from the solid-state image sensor 22. For example, while details will be described later, the solid-state image sensor 22, which has a pixel for detecting a focus, performs processing of processing a signal from the pixel and detecting a focus. Further, the solid-state image sensor 22, which has a pixel for constructing an image of the shot subject, also performs processing of processing a signal from the pixel and decompressing the image in the frame memory 24.

The display unit 25, which is formed with a panel display device such as a liquid crystal display device and an organic electro luminescence (EL) display device, displays a moving image or a still image shot at the solid-state image sensor 22. The recording unit 26 records a moving image or a still image shot at the solid-state image sensor 22 in a recording medium such as a hard disk drive (HDD).

The operating unit 27 issues an operation command regarding various functions of the imaging device under operation by a user. The power supply unit 28 supplies various kinds of power supplies which become operation power supplies of the DSP circuit 23, the frame memory 24, the display unit 25, the recording unit 26 and the operating unit 27 to these supply targets as appropriate.

The imaging device having the above-described configuration can be used as an imaging device such as a camera module for a mobile apparatus such as a mobile phone, as well as a video camera and a digital still camera.

<Configuration of Image Sensor>

Figure 2:
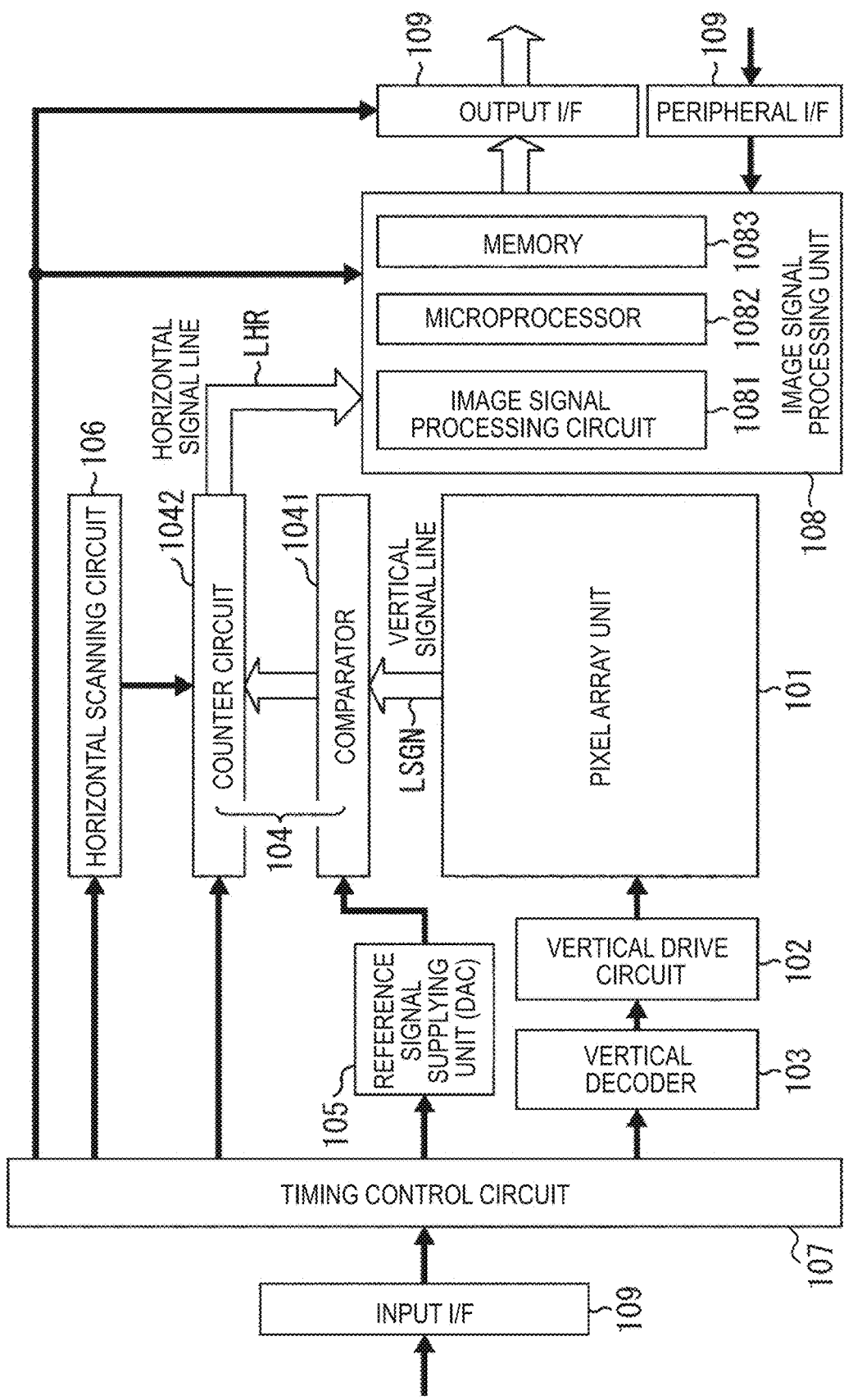
FIG. 2 is a diagram illustrating a configuration of a solid-state image sensor.

FIG. 2 is a diagram illustrating a configuration of the solid-state image sensor 22, and a system configuration diagram schematically illustrating a configuration of, for example, a CMOS image sensor which is one type of an X-Y address scheme imaging device. Here, the CMOS image sensor is an image sensor which is manufactured by applying or partially using CMOS process.

The solid-state image sensor 22 in FIG. 2 has a pixel array unit 101 in which a plurality of unit pixels (not illustrated) including photoelectric conversion elements are arranged in matrix in a two dimensional manner. The solid-state image sensor 22 includes a vertical drive circuit (row scanning circuit) 102, a vertical decoder 103, a column processing unit 104, a reference signal supplying unit 105, a horizontal scanning circuit (column scanning circuit) 106, a timing control circuit 107 and an image signal processing unit 108.

The solid-state image sensor 22 further has an I/F system circuit 109. The column processing unit 104 includes a comparator 1041 and a counter circuit 1042.

In this solid-state image sensor 22, the timing control circuit 107 generates a clock signal or a control signal which becomes a reference of operation of the vertical drive circuit 102, the column processing unit 104, the reference signal supplying unit 105, the horizontal scanning circuit 106, or the like, based on a master clock.

As a unit pixel, although not illustrated here, a photoelectric conversion element (for example, a photodiode) is provided. The unit pixel has, for example, a transfer transistor configured to transfer charge obtained by performing photoelectric conversion at the photoelectric conversion element to a floating diffusion (FD) unit, in addition to the photoelectric conversion element.

As the unit pixel, one configured with three transistors including a reset transistor configured to control electrical potential of the FD unit and an amplifier transistor configured to output a signal according to the electrical potential of the FD unit, in addition to the transfer transistor can be applied. Alternatively, as the unit pixel, one configured with four transistors further including a select transistor configured to perform pixel selection can be used.

In the pixel array unit 101, unit pixels of m rows and n columns are arranged in a two dimensional manner, and, for this pixel arrangement of m rows and n columns, a row control line is wired for each row, and a column signal line is wired for each column. Each one end of the row control line is connected to each output terminal corresponding to each row of the vertical drive circuit 102. The vertical drive circuit 102 which is configured with a shift resistor, or the like, controls row address and row scanning of the pixel array unit 101 via the row control lines.

The column processing unit 104 has an analog digital converter (ADC) provided for, for example, each pixel column of the pixel array unit 101, that is, for each vertical signal line LSGN, converts an analog signal output for each column from each unit pixel of the pixel array unit 101 into a digital signal and outputs the digital signal.

The reference signal supplying unit 105 has, for example, a digital analog converter (DAC) as a unit which generates a so-called reference voltage Vref having a ramp waveform, whose level changes slopewise over time.

Note that the unit which generates the reference voltage Vref having a ramp waveform is not limited to the DAC.

The DAC generates the reference voltage Vref having a ramp waveform based on a clock provided from the timing control circuit 107 under control by a control signal provided from the timing control circuit 107, and supplies the reference voltage Vref to the ADC of the column processing unit 104.

Note that each of the ADC has a configuration which enables AD conversion operation to be selectively performed corresponding to each operation mode of a normal frame rate mode in a progressive scanning scheme in which information of all the unit pixels is read out and a high-speed frame rate mode.

The high-speed frame rate mode is an operation mode in which an exposure period of the unit pixels are set at 1/N of that upon the normal frame rate mode, and the frame rate is made N times, for example, twice as high as that upon the normal frame rate mode. Switching of the operation mode is executed by control by the control signal provided from the timing control circuit 107. Further, instruction information for switching between the normal frame rate mode and the high-speed frame rate mode is provided to the timing control circuit 107 from an external system controller (not illustrated).

The ADCs have the same configuration, and each of the ADCs has a comparator 1041, and a counter circuit 1042. For example, an up/down counter, a transfer switch and a memory device are included.

The comparator 1041 compares a signal voltage of a vertical signal line according to a signal output from each unit pixel in the n-th column of the pixel array unit 101 with the reference voltage Vref having a ramp waveform supplied from the reference signal supplying unit 105.

Output Vco of the comparator 1041 becomes an "H" level, for example, when the reference voltage Vref is greater than the signal voltage, and the output Vco becomes an "L" level when the reference voltage Vref is equal to or smaller than the signal voltage Vx.

To the counter circuit 1042 which is an up/down counter and which is an asynchronous counter, a clock from the timing control circuit 107 is provided at the same time as that provided to the DAC under control by the control signal provided from the timing control circuit 107. The counter circuit 1042 performs down counting or up counting in synchronization with the clock, thereby counts a comparison period from when comparison operation is started at the comparator until when the comparison operation is finished.

In this manner, the analog signal supplied for each column by way of a column signal line from each unit pixel of the pixel array unit 101 is converted into an N-bit digital signal through each operation of the comparator 1041 and the up/down counter circuit 1042 and stored in the memory device.

The horizontal scanning circuit 106 which is configured with a shift resistor, or the like, controls column address and column scanning of the ADC in the column processing unit 104. Under control by this horizontal scanning circuit 106, the N-bit digital signals which are AD converted at the ADCs are sequentially read out to the horizontal signal line LHR, and output to the image signal processing unit 108 as imaging data by way of this horizontal signal line LHR.

The image signal processing unit 108 which is a circuit that performs various kinds of signal processing on the imaging data, includes an image signal processor (ISP) 1081, a microprocessor 1082, a memory 1083, or the like.

<Circuit Arrangement when Image Sensor is Configured with a Plurality of Layers>

An example of circuit arrangement when the solid-state image sensor 22 illustrated in FIG. 2 is configured with one substrate is illustrated. Note that, for explanation, in the description of FIG. 3 and thereafter, description will be continued assuming that the solid-state image sensor 22 is configured with the pixel array unit 101, the column processing unit 104, the peripheral circuit 130 and the row circuit 131.

The row circuit 131 and the column processing unit 104 are provided to select arbitrary pixels in the pixel array unit 101 through the operation. The column processing unit 104 processes data of the vertical signal line, and the row circuit controls a pixel control signal. The row circuit 131 has a configuration including the vertical drive circuit 102, or the like, and includes a circuit configured to control row address and row scanning of the pixel array unit 101 via the row control line. The peripheral circuit 130 has a configuration including the image signal processing unit 108, or the like.

Figure 3:
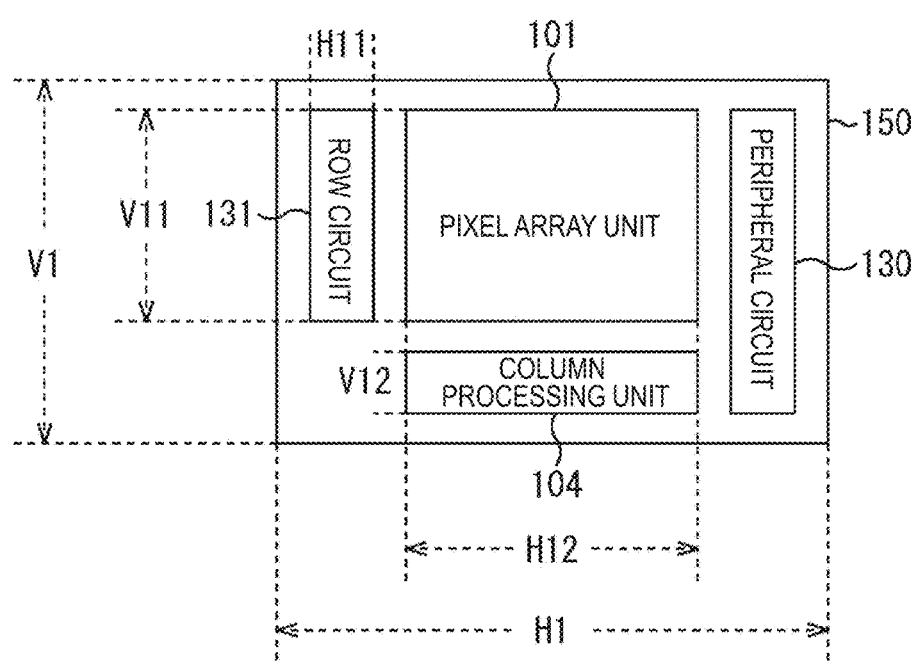
FIG. 3 is a diagram for explaining circuit arrangement.

Referring to FIG. 3, the pixel array unit 101 is disposed at the central portion of the substrate 150, and the row circuit 131 is disposed at the left side of the pixel array unit 101, the column processing unit 104 is disposed below the pixel array unit 101, and the peripheral circuit 130 is disposed at the right side of the pixel array unit 101. The length of the pixel array unit 11 in a vertical direction is set as a length V11, and the length in a horizontal direction is set as a length H12. The length of the row circuit 131 in a vertical direction is the same as the length of the pixel array unit 101 in the vertical direction and the length V11. Note that, here, while description will be continued assuming that the length of the row circuit 131 in the vertical direction is the same as the length of the pixel array unit 101 in the vertical direction, the length of the row circuit 131 may be longer than the length of the pixel array unit 101.

The length of the row circuit 131 in a horizontal direction is set as a length H11. The length of the column processing unit 104 in a horizontal direction is the same as the length of the pixel array unit 101 in the horizontal direction, and the length H12. The length of the column processing unit 104 in the vertical direction is a length V12. Note that, here, while description will be continued assuming that the length of the column processing unit 104 in the horizontal direction is the same as the length of the pixel array unit 101 in the horizontal direction, the length of the column processing unit 104 may be longer than the length of the pixel array unit 101.

A layout pitch of pixels of the pixel array unit 101, a layout pitch of the column processing unit 104 and a layout pitch of the row circuit 131 are preferably the same, or the layout pitch of the column processing unit 104 and the layout pitch of the row circuit 131 are preferably larger than the layout pitch of the pixels. The reason will be explained in the following description.

The peripheral circuit 130 can be disposed in a residual portion on the substrate 150 after the column processing unit 104 and the row circuit 131 are disposed, and the length in a vertical direction and a horizontal direction are not specified in the description.

The length of the substrate 150 in the vertical direction is a length V1, which is equal to or longer than the combined length of the length V11 of the row circuit 131 and the length V12 of the column processing unit 104. In a similar manner, the length of the substrate 150 in the horizontal direction is a length H1, which is equal to or longer than the combined length of the length H11 of the row circuit 131 and the length HV12 of the column processing unit 104.

By the way, in the imaging device 10, or the like, illustrated in FIG. 1, it is desired to realize the solid-state image sensor 22 with more pixels, higher image quality, higher speed and a further smaller size. As the solid-state image sensor 22 which satisfies these desires, it is considered to laminate substrates to make the solid-state image sensor 22 smaller. A laminate type solid-state image sensor 22 has a structure in which a substrate on which a signal processing circuit is formed is used in place of a support substrate of the solid-state image sensor 22, and a pixel portion is superimposed thereon. By employing such a structure, the solid-state image sensor 22 can be made smaller.

Figure 4:
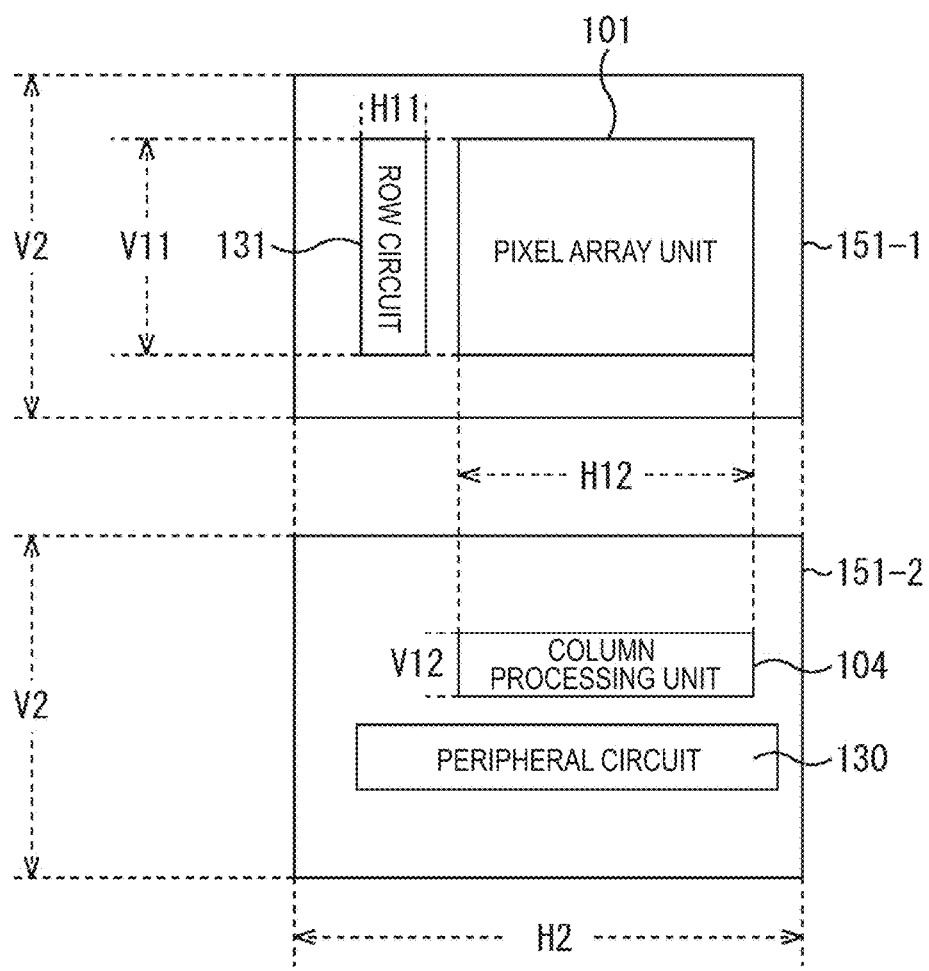
FIG. 4 is a diagram for explaining circuit arrangement.

When the solid-state image sensor 22 illustrated in FIG. 3 is made to have a laminate structure, it is possible to realize a circuit configuration as illustrated in FIG. 4.

FIG. 4 is a diagram illustrating an example of the circuit configuration at each substrate when the solid-state image sensor 22 is configured with two substrates to realize a configuration in which two substrates are superimposed, that is, a laminate type solid-state image sensor 22. Note that, in the following description, the laminate type is a chip having a configuration in which a plurality of substrates are superimposed.

Further, in the following description, while the substrates will be described as the first-layer substrate, the second-layer substrate, the first-layer means the substrate disposed on the top, and the second-layer means the substrate disposed under the first-layer. The third-layer also means the substrate disposed under the second-layer.

FIG. 4 illustrates the solid-state image sensor 22 for explaining circuit arrangement when the solid-state image sensor 22 is formed as a chip in which two substrates are laminated.

The pixel array unit 101 and the row circuit 131 are disposed on the first-layer substrate 151-1. The column processing unit 104 and the peripheral circuit 130 are disposed on the second-layer substrate 151-2. When the solid-state image sensor 22 illustrated in FIG. 4 is compared with the solid-state image sensor 22 illustrated in FIG. 3, by configuring the image sensor with two layers, it is possible to dispose the column processing unit 104 and the peripheral circuit 130 on the second-layer substrate 151-2, so that it is possible to reduce a substrate size accordingly.

The length of the first-layer substrate 151-1 of the solid-state image sensor 22 illustrated in FIG. 4 in the vertical direction is a length V2. The length V2 is shorter than the length V1 (FIG. 3) which is the length in the vertical direction when the solid-state image sensor 22 is configured with one layer by at least the length V12 of the column processing unit 104 in the vertical direction.

Further, the length of the first-layer substrate 151-1 of the solid-state image sensor 22 illustrated in FIG. 4 in the horizontal direction is a length H2. The length H2 is shorter than the length H1 (FIG. 3) which is the length in the horizontal direction when the solid-state image sensor 22 is configured with one layer by at least the length of the peripheral circuit 130 in the horizontal direction.

In this manner, by configuring the solid-state image sensor 22 as a laminate type image sensor in which two substrates are laminated, it is possible to make the lengths of the substrate 151-1 (151-2) in the vertical direction and in the horizontal direction shorter than the lengths of the substrate 150 (FIG. 3). That is, it is possible to make the solid-state image sensor 22 smaller.

Figure 5:
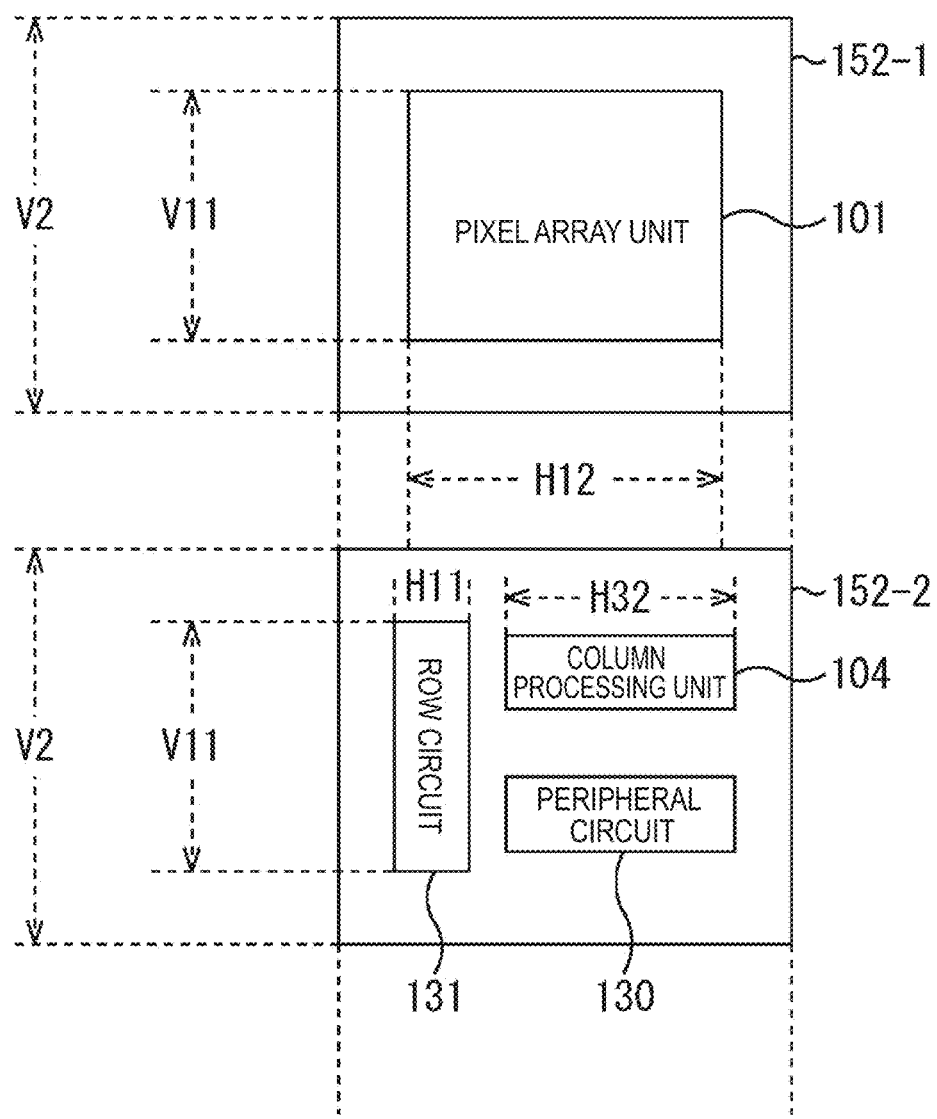
FIG. 5 is a diagram for explaining circuit arrangement.

However, it is possible to make the solid-state image sensor 22 further smaller than that in the circuit configuration illustrated in FIG. 4 by employing a circuit configuration illustrated in FIG. 5.

While the solid-state image sensor 22 illustrated in FIG. 5 is a chip in which two substrates are laminated as with the solid-state image sensor 22 illustrated in FIG. 4, the solid-state image sensor 22 illustrated in FIG. 5 is different from the solid-state image sensor 22 illustrated in FIG. 4 in that the row circuit 131 is disposed on the second-layer substrate 152-2. That is, on the first-layer substrate 152-1 illustrated in FIG. 5, only the pixel array unit 101 is disposed, and, on the second-layer substrate 152-2, the column processing unit 104, the peripheral circuit 130 and the row circuit 131 are disposed.

By disposing only the pixel array unit 101 on the first-layer substrate 152-1 in this manner, the size of the substrate 152-1 can be made substantially the same size as the size of the pixel array unit 101. Further, by making the size of the substrate 152-2 to be laminated the same as the size of the substrate 152-1, the size of the substrate 152-2 can be made substantially the same as the size of the pixel array unit 101.

In this case, the lengths of the substrate 152-1 and the substrate 152-2 in the vertical direction can be made the length V2, and the lengths in the horizontal direction can be made the length H2. While the length in the vertical direction is the same as that in the case illustrated in FIG. 4, the length in the horizontal direction becomes shorter by at least the length of the row circuit 131. Therefore, it is possible to make the solid-state image sensor 22 smaller.

In the case of the circuit arrangement as illustrated in FIG. 5, because the column processing unit 104 and the row circuit 131 are disposed on the substrate 152-2, the length of the column processing unit 104 in the horizontal direction becomes a length H32. The length H32 is shorter than the length H12 of the column processing unit 104 disposed on the substrate 151-2 illustrated in FIG. 4.

In other words, in the case of the circuit arrangement illustrated in FIG. 5, the length H32 of the column processing unit 104 in the horizontal direction, disposed on the second-layer substrate 152-2 is shorter than the length H12 of the pixel array unit 101 in the horizontal direction, disposed on the first-layer substrate 152-1.

This difference in the length requires a wiring region for pitch transfer between the pixel array unit 101 and the column processing unit 104. Further, there is a possibility that layout efficiency of the column processing unit 104 becomes worse and the area becomes larger as the pitch becomes narrower. Therefore, it is difficult to make the column processing unit 104 smaller to reduce the size of the substrate 152-2, and if the size is made smaller, there is a possibility that performance of the column processing unit 104 may degrade.

Further, the ADC (not illustrated) included in the column processing unit 104 has many transistors, and it is difficult to make the ADC smaller. Therefore, in order to make the ADC smaller, there is a possible way in which one ADC is shared among a plurality of pixels. However, if one ADC is shared with a plurality of pixels, readout control is performed while signals from the plurality of pixels are switched.

Therefore, if one ADC has many pixels, a time difference of readout pixels becomes larger, and there is a possibility that, when a moving object is imaged, the object is imaged as a distorted object, or it takes time to read out one image.

In this manner, because there is a possibility that image quality may degrade or high-speed shooting cannot be performed by making the column processing unit 104 smaller, it is not preferable to make the column processing unit 104 smaller, for example, making the length of the column processing unit 104 shorter than the length of the pixel array unit 101 in the horizontal direction. Therefore, it is preferable to design the length of the column processing unit 104 in the horizontal direction so as to be equal to or longer than the length H12 of the pixel array unit 101 in the horizontal direction.

While, as illustrated in FIG. 4, it is preferable to dispose the row circuit 131 on the first-layer substrate 151-2 in this regard, such arrangement makes the size of the substrate larger than that in the circuit arrangement illustrated in FIG. 5.

<First Circuit Arrangement of Chip Having Three-Layer Laminate Structure>

Figure 6:
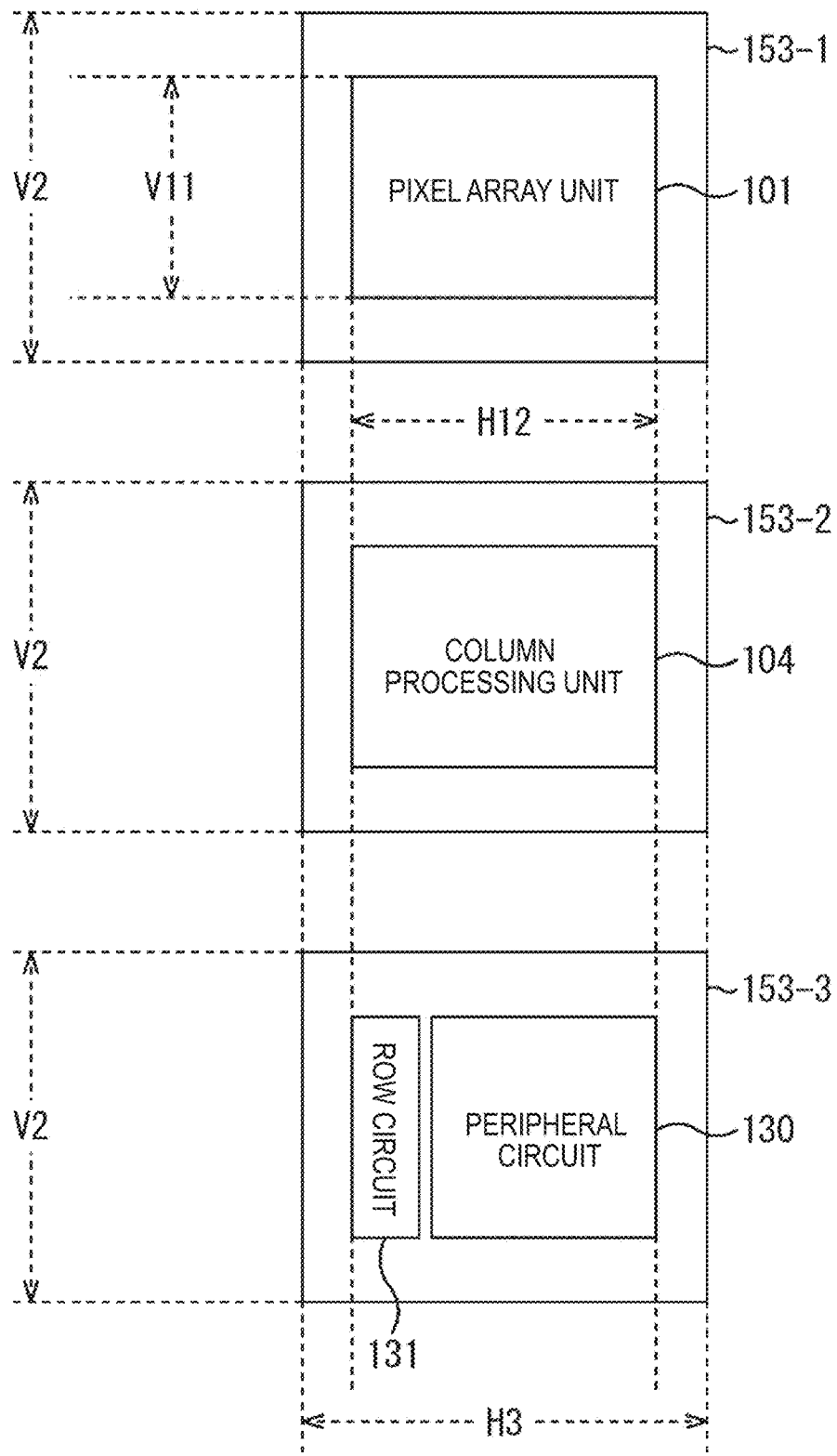
FIG. 6 is a diagram for explaining circuit arrangement.

Therefore, as illustrated in FIG. 6, a three-layer structure is employed. Referring to FIG. 6, only the pixel array unit 101 is disposed on the first-layer substrate 153-1. The column processing unit 104 is disposed on the second-layer substrate 153-2. The peripheral circuit 130 and the row circuit 131 are disposed on the third-layer substrate 153-3.

By employing such a configuration, the size of the first-layer substrate 153-1 can be made substantially the same as the size of the pixel array unit 101. Further, the size of the substrate 153-2 and the substrate 153-3 to be laminated becomes the same as that of the substrate 153-1. In this case, the size of each substrate 153 has the length V2 in the vertical direction and the length H3 in the horizontal direction.

Because the size of each substrate 153 can be made substantially the same as that of the pixel array unit 101, it is possible to make the chip smaller. Note that while, for example, the size of the substrate 153-1 is made larger than the pixel array unit 101 in FIG. 6, or the like, for explanation, it is possible to make the size substantially the same.

Because, in the chip illustrated in FIG. 6, it is also possible to employ a configuration where only the column processing unit 104 is disposed on the second-layer substrate 153-2, for example, it is also possible to design the chip such that the size of the column processing unit 104 is made the same as the size of the pixel array unit 101. This will not cause the above-described problems, for example, a problem that a wiring region for pitch transfer is required, and will not degrade efficiency of layout. Therefore, it is possible to prevent degradation of performance of the column processing unit 104.

In the chip illustrated in FIG. 6, when parallelism of the column circuit is increased to achieve higher speed, because it is also possible to employ a configuration where only the column processing unit 104 is disposed on the second-layer substrate 153-2, for example, it is also possible to design the chip such that the size of the column processing unit 104 is made the same as the size of the pixel array unit 101.

This will not cause the above-described problems, for example, a problem that a wiring region for pitch transfer is required, and will not degrade efficiency of layout. Therefore, it is possible to prevent degradation of performance of the column processing unit 104. Further, this is an advantageous effect obtained by applying the present technology, which can be also obtained in circuit arrangement which will be described below.

In the chip illustrated in FIG. 6, the length of the row circuit 131 in the vertical direction can be made equal to or longer than the length of the pixel array unit 101 in the vertical direction, and the length of the column processing unit 104 in the horizontal direction can be made equal to or longer than the length of the pixel array unit 101 in the horizontal direction.

According to the present technology, because the pixel array unit 101, the column processing unit 104 and the row circuit 131 can be disposed on different substrates, it is possible to make the size of the column processing unit 104 and the row circuit 131 larger within a size of the substrate on which the column processing unit 104 and the row circuit 131 are disposed. The substrate has substantially the same size as that of the substrate on which the pixel array unit 101 is disposed as described above. Therefore, it is possible to make the length of a predetermined side of the column processing unit 104 and the length of a predetermined side of the row circuit 131 longer than the length of a predetermined side of the pixel array unit 101.

As described above, while there is a possibility that image quality may degrade or high-speed shooting cannot be performed if the column processing unit 104 is made smaller, because it is not necessary to make the column processing unit 104 and the row circuit 131 smaller than necessary, it is possible to eliminate a possibility that image quality may degrade or high-speed shooting cannot be performed.

Further, in the case of the laminate type chip, a chip on which a signal processing circuit is formed is used in place of a support substrate of a pixel portion, and the pixel portion is superimposed thereon. Therefore, even in the case of the three-layer structure as illustrated in FIG. 6, a thickness of the chip does not substantially change, for example, compared to the one-layer structure illustrated in FIG. 3, or the two-layer structure as illustrated in FIG. 4 and FIG. 5, and, thus, the lamination neither increases the thickness nor makes it difficult to make the chip smaller.

Therefore, although not illustrated, it is also possible to configure the chip with three or more layers. For example, it is also possible to employ a four-layer structure, and dispose a memory on the fourth-layer substrate by applying the present technology.

<Second Circuit Arrangement of Chip Having Three-Layer Laminate Structure>

Figure 7:
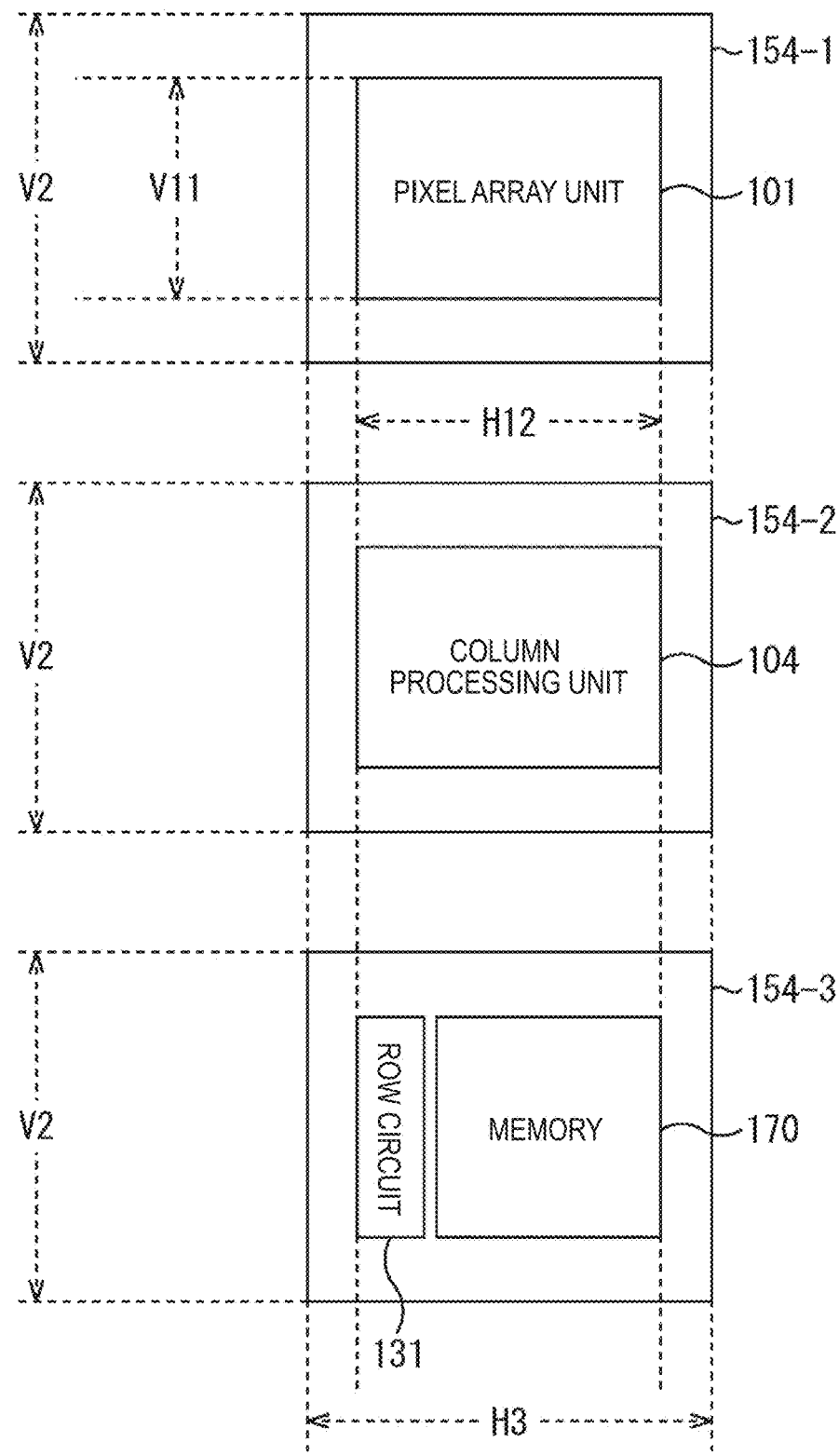
FIG. 7 is a diagram for explaining circuit arrangement.

Further, as illustrated in FIG. 7, it is also possible to employ a configuration where the memory 170 is disposed on the third layer. The chip illustrated in FIG. 7 is a chip in which three substrates are laminated as with the chip illustrated in FIG. 6, and only the pixel array unit 101 is disposed on the first-layer substrate 154-1, and the column processing unit 104 is disposed on the second-layer substrate 154-2.

Therefore, the chip having the circuit arrangement illustrated in FIG. 7 can also provide the same advantageous effects as those provided by the chip having the circuit arrangement illustrated in FIG. 6.

The row circuit 131 and the memory 170 are disposed on the third-layer substrate 153-3 of the chip illustrated in FIG. 7. In this manner, the memory 170 may be disposed on the third layer. Further, when a plurality of memories 170 are required, although not illustrated, it is also possible to employ a configuration where the memory 170 is also provided on the fourth-layer substrate. The peripheral circuit 130 (not illustrated in FIG. 7) can be disposed at a residual portion on the second-layer substrate 154-2 or the third-layer substrate 154-3 or on the fourth-layer substrate.

Note that, the residual portion is a portion where nothing is disposed on the second-layer and the third-layer substrates having the same size as that of the first-layer substrate after the column processing unit 104 and the row circuit 131 are disposed.

<Third Circuit Arrangement of Chip Having Three-Layer Laminate Structure>

Figure 8:
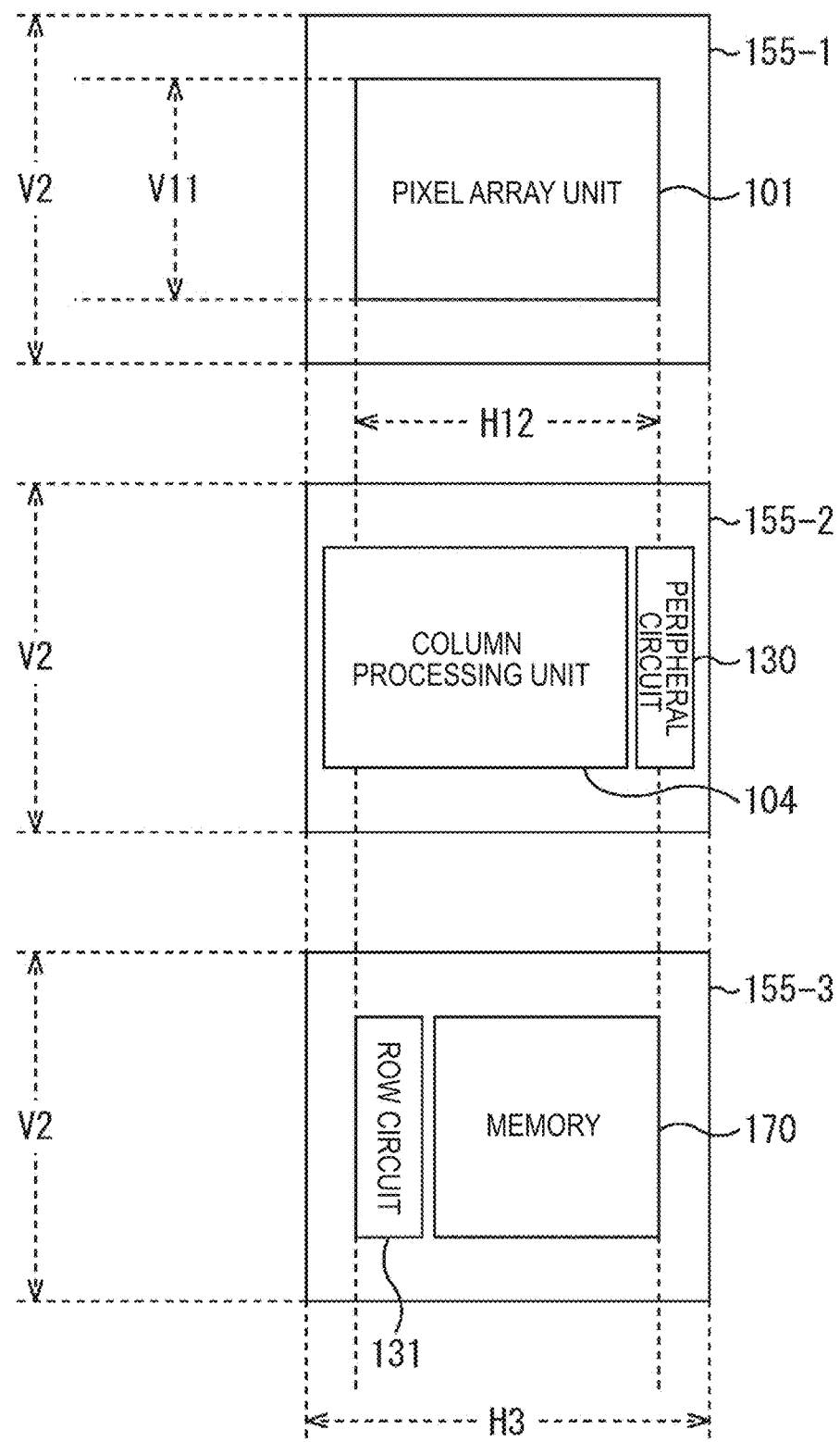
FIG. 8 is a diagram for explaining circuit arrangement.

It is also possible to employ circuit arrangement as illustrated in FIG. 8 to dispose the peripheral circuit 130 at a residual portion on the substrate. The chip illustrated in FIG. 8 has basically the same arrangement of circuits disposed in each layer as that of the chip having the circuit arrangement illustrated in FIG. 7.

The chip illustrated in FIG. 8 is different from the chip having the circuit arrangement illustrated in FIG. 7 in that the center of the column processing unit 104 disposed on the second-layer substrate 155-2 is displaced from the center of the substrate 155-2. For example, in the above-described chip illustrated in FIG. 7, an example has been described where the center of the second-layer substrate 154-2 matches the center of the column processing unit 104. In other words, the column processing unit 104 illustrated in FIG. 7 is disposed at a position directly below the pixel array unit 101 when the substrates are laminated.

On the other hand, the center of the column processing unit 104 illustrated in FIG. 8 is displaced from the center of the substrate 154-2. In other words, the column processing unit 104 illustrated in FIG. 8 is disposed at a position displaced from the pixel array unit 101 in the horizontal direction when the substrates are laminated. Further, in other words, in the example illustrated in FIG. 8, the central axis of the column processing unit 104 in the vertical direction is disposed at a position displaced from the central axis of the substrate 155-2 in the vertical direction (the central axis of the pixel array unit 101 in the vertical direction).

In the example illustrated in FIG. 8, by displacing the column processing unit 104 to the left side of the substrate 155-2, a portion is left at the right side of the substrate 155-2. The peripheral circuit 130 can be disposed at the portion. Also in this case, because the column processing unit 104 is disposed on the substrate 155-2 while the length H12 of the column processing unit 104 in the horizontal direction is made the same as the length H12 of the pixel array unit 101 in the horizontal direction, the performance of the column processing unit 104 does not degrade.

Note that, in the circuit arrangement illustrated in FIG. 8, while an example has been described where the column processing unit 104 is displaced to the left side in the horizontal direction, it is also possible to displace the column processing unit 104 to the right side.

<Fourth Circuit Arrangement of Chip Having Three-Layer Laminate Structure>

Figure 9:
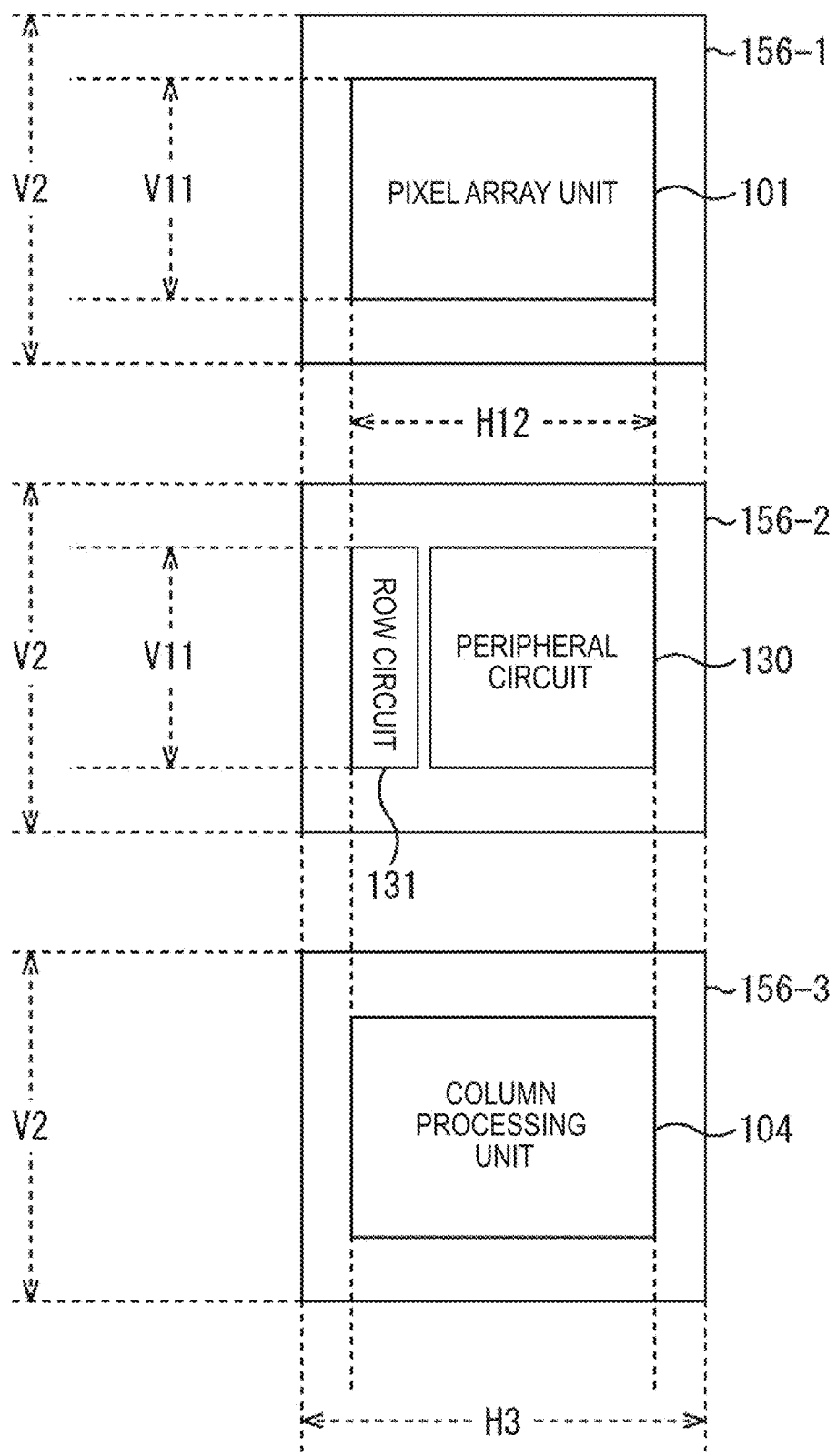
FIG. 9 is a diagram for explaining circuit arrangement.
Figure 10:
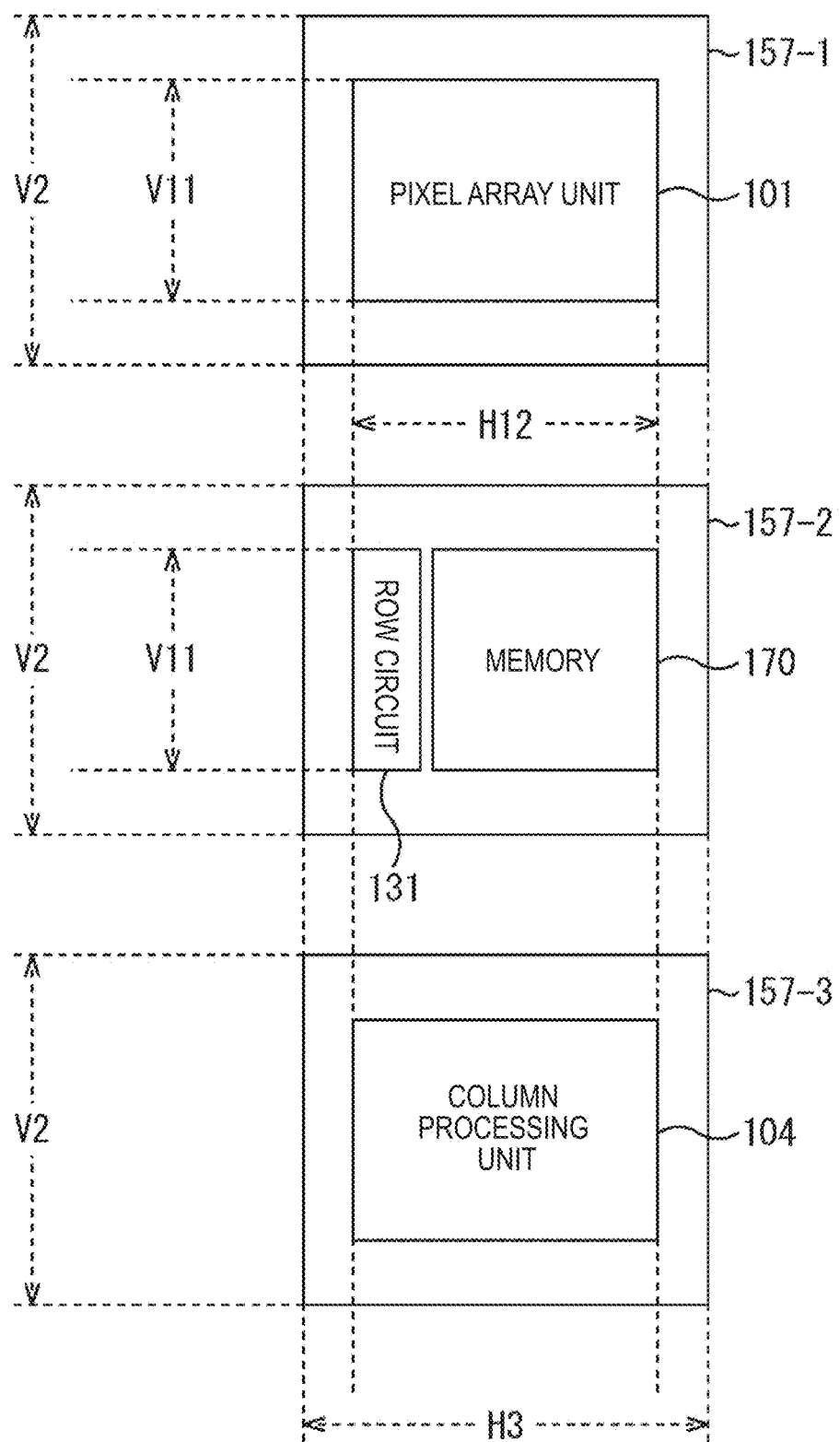
FIG. 10 is a diagram for explaining circuit arrangement.
Figure 11:
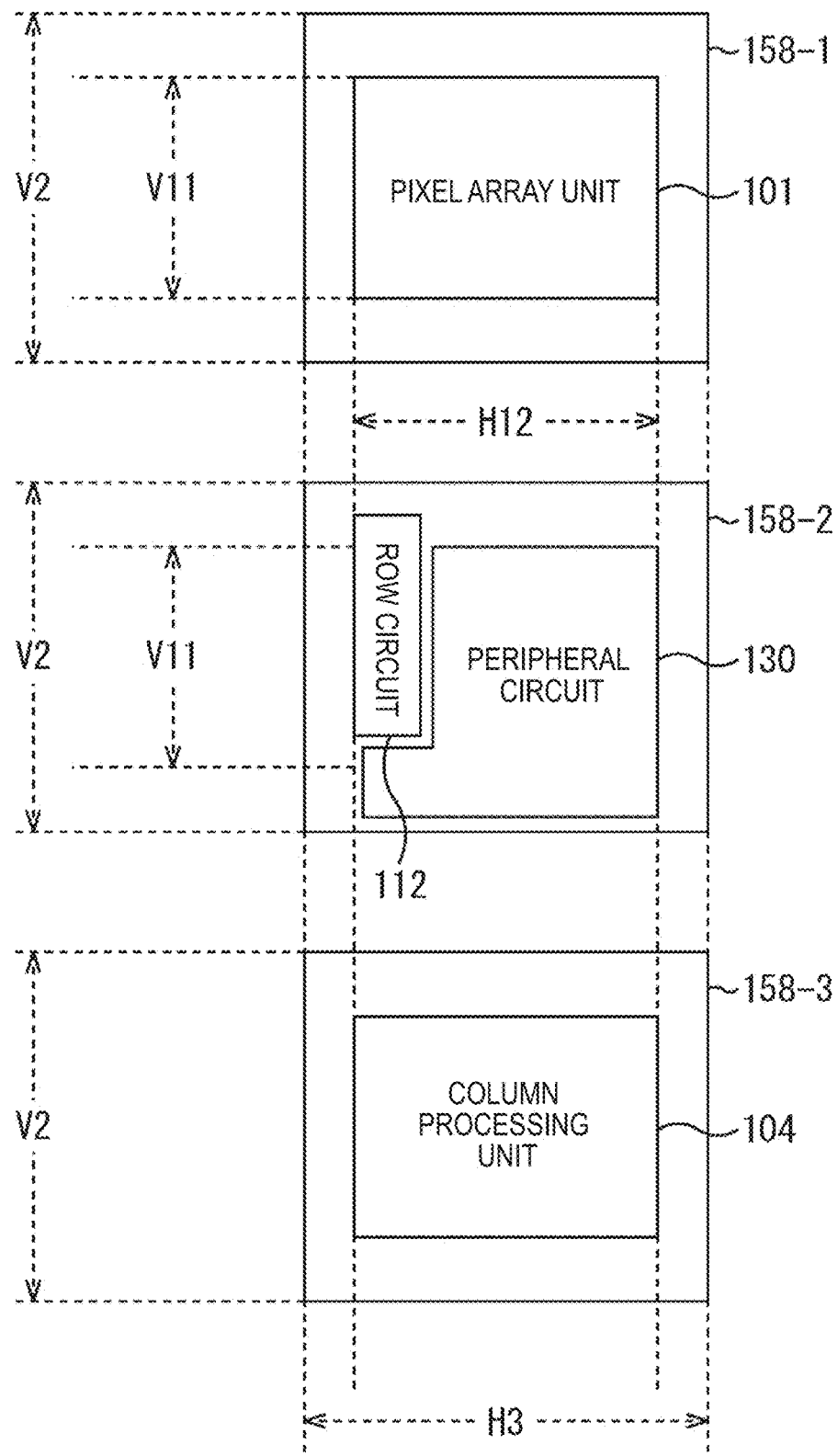
FIG. 11 is a diagram for explaining circuit arrangement.

In the circuit arrangement of the chip illustrated in FIG. 6 to FIG. 8, an example has been described where the column processing unit 104 is disposed on the second-layer substrate. The substrate on which the column processing unit 104 is disposed is not limited to the second-layer substrate, and the column processing unit 104 may be disposed on the third-layer substrate. FIG. 9 to FIG. 11 illustrate examples where the column processing unit 104 is disposed on the third-layer substrate.

FIG. 9 is a diagram illustrating an example of circuit arrangement of the chip having a three-layer laminate structure. On the first-layer substrate 156-1 of the chip illustrated in FIG. 9, only the pixel array unit 101 is disposed. The peripheral circuit 130 and the row circuit 131 are disposed on the second-layer substrate 156-2. The column processing unit 104 is disposed on the third-layer substrate 156-3.

This circuit arrangement is arrangement in which the second layer is replaced with the third layer in the circuit arrangement of the chip illustrated in FIG. 6. Even when the second layer is replaced with the third layer, and the column processing unit 104 is disposed on the third-layer substrate 156-3 in this manner, it is obvious that it is possible to provide the same advantageous effects as those provided in the case where the column processing unit 104 is disposed on the second-layer substrate (the chip illustrated in FIG. 6), and make the chip smaller.

<Fifth Circuit Arrangement of Chip Having Three-Layer Laminate Structure>

A configuration in which the second layer is replaced with the third layer in the circuit arrangement of the chip having the three-layer laminate structure illustrated in FIG. 7 is illustrated in FIG. 10. In an example of the circuit arrangement of the chip having the three-layer laminate structure illustrated in FIG. 10, only the pixel array unit 101 is disposed on the first-layer substrate 157-1, the row circuit 131 and the memory 170 are disposed on the second-layer substrate 157-2, and the column processing unit 104 is disposed on the third-layer substrate 156-3.

Even when the second layer is replaced with the third layer, and the column processing unit 104 is disposed on the third-layer substrate 156-3 in this manner, it is obvious that it is possible to provide the same advantageous effects as those provided in the case where the column processing unit 104 is disposed on the second-layer substrate (the chip illustrated in FIG. 7), and make the chip smaller.

<Sixth Circuit Arrangement of Chip Having Three-Layer Laminate Structure>

In the above-described circuit arrangement of the chip having the three-layer laminate structure illustrated in FIG. 8, an example has been described where the center of the column processing unit 104 disposed on the second-layer substrate 155-2 is located at a position different from the center of the substrate 155-2. It is also possible to displace the row circuit 131 instead of displacing the column processing unit 104.

While the circuit arrangement of the chip having the three-layer laminate structure illustrated in FIG. 11 is the same as the circuit arrangement of the chip having the three-layer laminate structure illustrated in FIG. 10, a position where the row circuit 131 is disposed on the second-layer substrate 158-2 is different. The center of the row circuit 131 disposed on the second-layer substrate 158-2 is located at a position displaced from the center of the substrate 158-2.

The center of the row circuit 131 illustrated in FIG. 11 is displaced in an upper direction from the center of the substrate 158-2. The position of the length V11 indicated at the left side of the substrate 158-2 in FIG. 11 does not indicate a position after the row circuit 131 is displaced, but indicates a position in the case where the row circuit 131 is located as illustrated in FIG. 10.

The row circuit 131 illustrated in FIG. 11 is disposed at a position displaced from the pixel array unit 101 in the vertical direction when the substrates are laminated. In other words, in the example illustrated in FIG. 11, the central axis of the row circuit 131 in the horizontal direction is disposed at a position displaced from the central axis of the substrate 158-2 in the horizontal direction (the central axis of the pixel array unit 101 in the horizontal direction).

In the example illustrated in FIG. 11, by displacing the row circuit 131 to an upper side of the substrate 158-2, a portion is left at a lower side of the substrate 158-2. The peripheral circuit 130 can be disposed at the portion. Also in this case, because the row circuit 131 is disposed on the substrate 158-2 while the length V11 of the row circuit 131 in the vertical direction is made the same as the length V11 of the pixel array unit 101 in the vertical direction, performance of the row circuit 131 does not degrade.

Note that, in the circuit arrangement illustrated in FIG. 11, while an example has been described where the row circuit 131 is displaced to an upper side in the vertical direction, it is also possible to displace the row circuit 131 to a lower side.

Further, as illustrated in FIG. 8, it is also possible to dispose the column processing unit 104 while displacing the center of the column processing unit 104 from the center of the substrate, and, as illustrated in FIG. 11, it is also possible to dispose the row circuit 131 while displacing the center of the row circuit 131 from the center of the substrate.

Further, in the examples illustrated in FIG. 8 and FIG. 11, while examples have been described where the position of the column processing unit 104 or the row circuit 131 disposed on the second-layer substrate is displaced with respect to the substrate, it is also possible to employ a configuration where the position of the column processing unit 104 or the row circuit 131 disposed on the second-layer substrate is displaced with respect to the substrate.

<Seventh Circuit Arrangement of Chip Having Three-Layer Laminate Structure>

Figure 12:
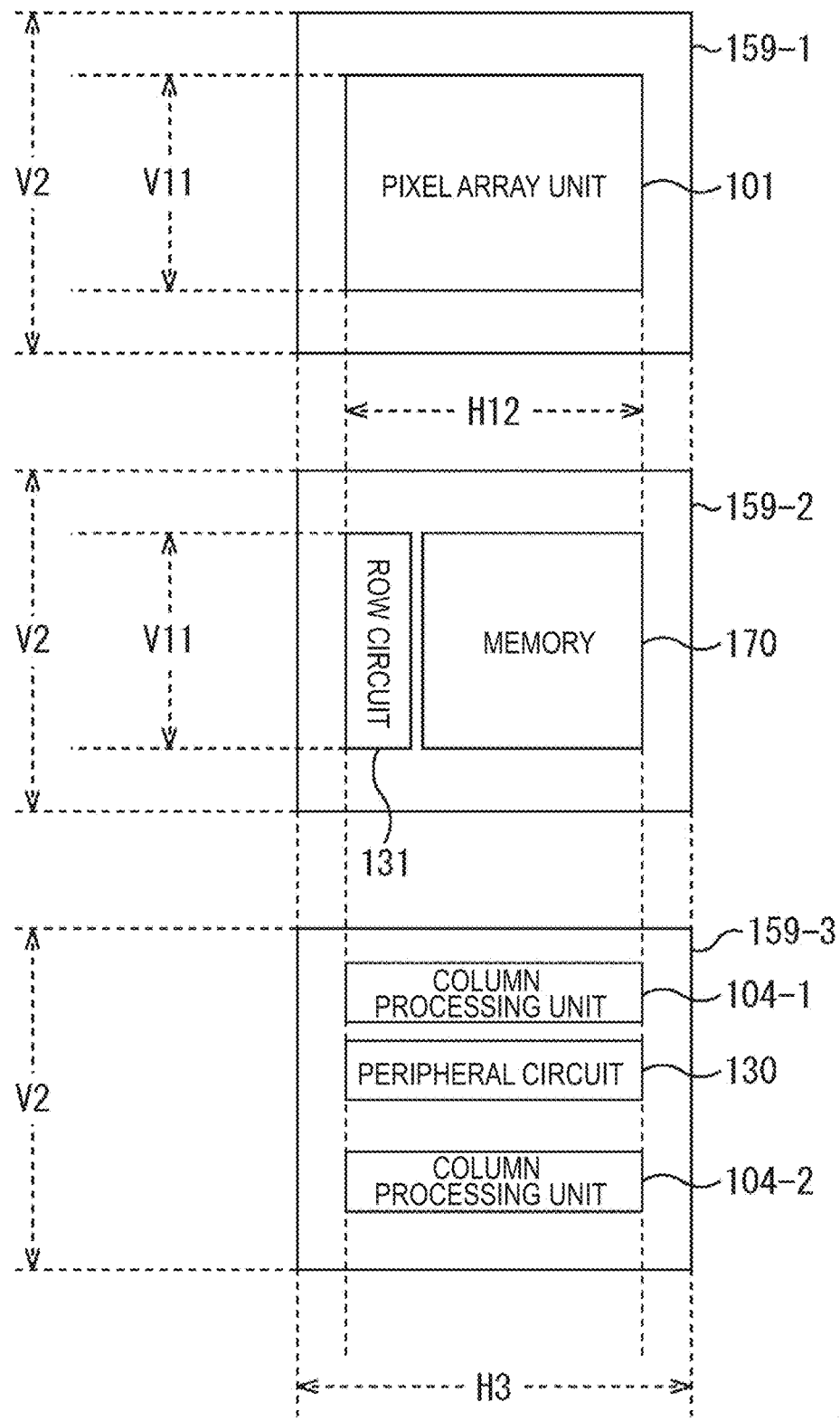
FIG. 12 is a diagram for explaining circuit arrangement.

While, in FIG. 6 to FIG. 11, examples have been described where the chip is configured with one column processing unit 104, the column processing unit 104 may be divided into a plurality of pieces and disposed on the substrate. In the circuit arrangement of the chip having the three-layer laminate structure illustrated in FIG. 12, the pixel array unit 101 is disposed on the first-layer substrate 159-1, and the row circuit 131 and the memory 170 are disposed on the second-layer substrate 159-2.

On the third-layer substrate 159-3, the column processing unit 104 is divided, and the column processing unit 104-1 and the column processing unit 104-2 are disposed. Further, the peripheral circuit 130 is disposed between the column processing unit 104-1 and the column processing unit 104-2 on the third-layer substrate.

It is also possible to divide the column processing unit 104 and dispose the divided column processing unit 104 on the substrate in this manner. Further, in the example illustrated in FIG. 12, while an example has been described where the column processing unit 104-1 and the column processing unit 104-2 are disposed on the third-layer substrate 159-3, it is also possible to employ a configuration where the column processing unit 104-1 and the column processing unit 104-2 are disposed on the second-layer substrate 159-2.

By disposing the pixel array unit 101 on the first-layer substrate and disposing the column processing unit 104 and the row circuit 131 on substrates which have the same size as that of the first-layer substrate and which are different underlying layers of the first layer in this manner, it is possible to make the chip smaller without degrading each performance of the column processing unit 104 and the row circuit 131.

Further, according to the present technology, by disposing the pixel array unit 101 on the first-layer substrate, the following advantageous effects can be provided. For example, as described with reference to FIG. 4, when the pixel array unit 101 and the row circuit 131 are disposed on the first-layer substrate 151-1, the chip size does not become a minimum. Further, a P-channel transistor for forming the row circuit 131 is required.

However, for example, as illustrated in FIG. 6, by disposing only the pixel array unit 101 on the first-layer substrate 153-1, it is possible to minimize the chip size as described above. Further, it is possible to realize process only with an N-channel transistor which is a high breakdown voltage transistor, and it is possible to reduce process cost relating to creation of the first-layer substrate.

<Signal Flow and Circuit Arrangement>

Figure 13:
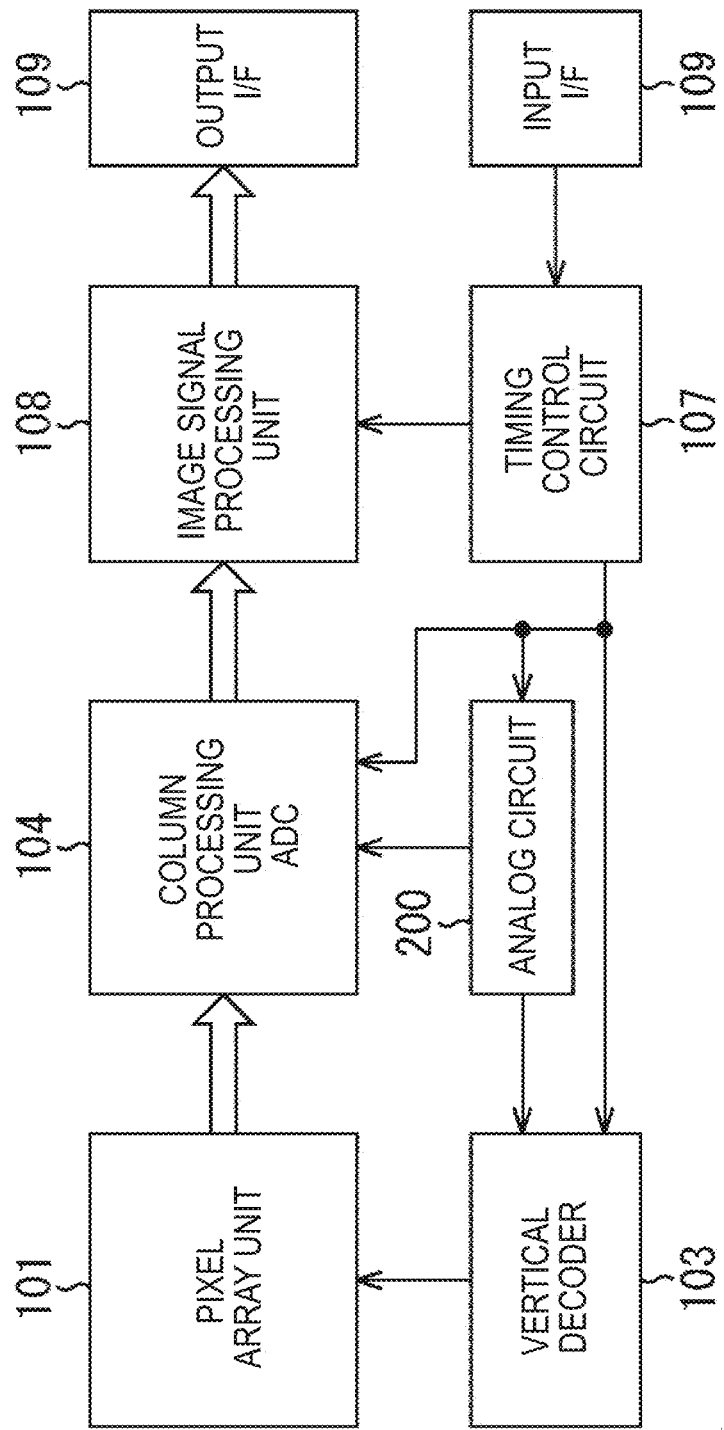
FIG. 13 is a diagram for explaining circuit arrangement in flow of signals.

Flow of a control signal and flow of a data signal in the chip having the three-layer laminate structure will be described next. FIG. 13 is a simplified diagram of the configuration of the solid-state image sensor 22 illustrated in FIG. 2 for explaining the flow of the control signal and the data signal. In FIG. 13, an arrow with a thin line indicates the control signal, and an arrow with a thick line indicates the data signal. Note that the control signal and the data signal are indicated in a similar manner in FIG. 14 to FIG. 16.

The control signal from the input I/F 109 is supplied to the timing control circuit 107. A clock signal, a control signal, or the like, which are generated at the timing control circuit 107 and which become a reference of operation of each unit are supplied to the vertical decoder 103, the analog circuit 200, the column processing unit 104 and the image signal processing unit 108.

The analog circuit 200 which is a circuit including the vertical drive circuit 102, the reference signal supplying unit 105 (FIG. 2), or the like, processes an analog signal. Note that the comparator 1041 (FIG. 2) in the column processing unit 104 is a circuit which processes an analog signal, and, in the example which will be described later with reference to FIG. 15, an example will be described where the column processing unit 104 is divided into an analog circuit and a digital circuit, and the analog circuit and the digital circuit are disposed on different substrates.

The control signal from the analog circuit 200 is supplied to the vertical decoder 103 as necessary. Further, the control signal from the analog circuit 200 is also supplied to the column processing unit 104 as necessary. The control signal from the vertical decoder 103 is supplied to the pixel array unit 101.

A data signal read out from pixels constituting the pixel array unit 101 is supplied to the image signal processing unit 108 via the column processing unit 104, and after being subjected to predetermined processing, supplied to the output I/F 109.

When the chip having such flow of the control signal and the data signal is configured as a chip having a three-layer laminate structure described with reference to FIG. 6 to FIG. 12, circuits disposed on respective substrates of the first layer, the second layer and the third layer will be described with reference to FIG. 14 to FIG. 16.

The chip having the three-layer laminate structure described with reference to FIG. 6 to FIG. 12 has an embodiment in which, mainly, the pixel array unit 101 is disposed on the first-layer substrate, and the column processing unit 104 and the row circuit 131 are disposed on different substrates among a plurality of substrates to be laminated.

The chip having the three-layer laminate structure which will be described with reference to FIG. 14 to FIG. 16 has an embodiment in which the circuits are disposed on different substrates among a plurality of substrates to be laminated according to a type of a signal to be processed, specifically, whether the circuit is a circuit which processes an analog signal or a circuit which processes a digital signal.

Figure 14:
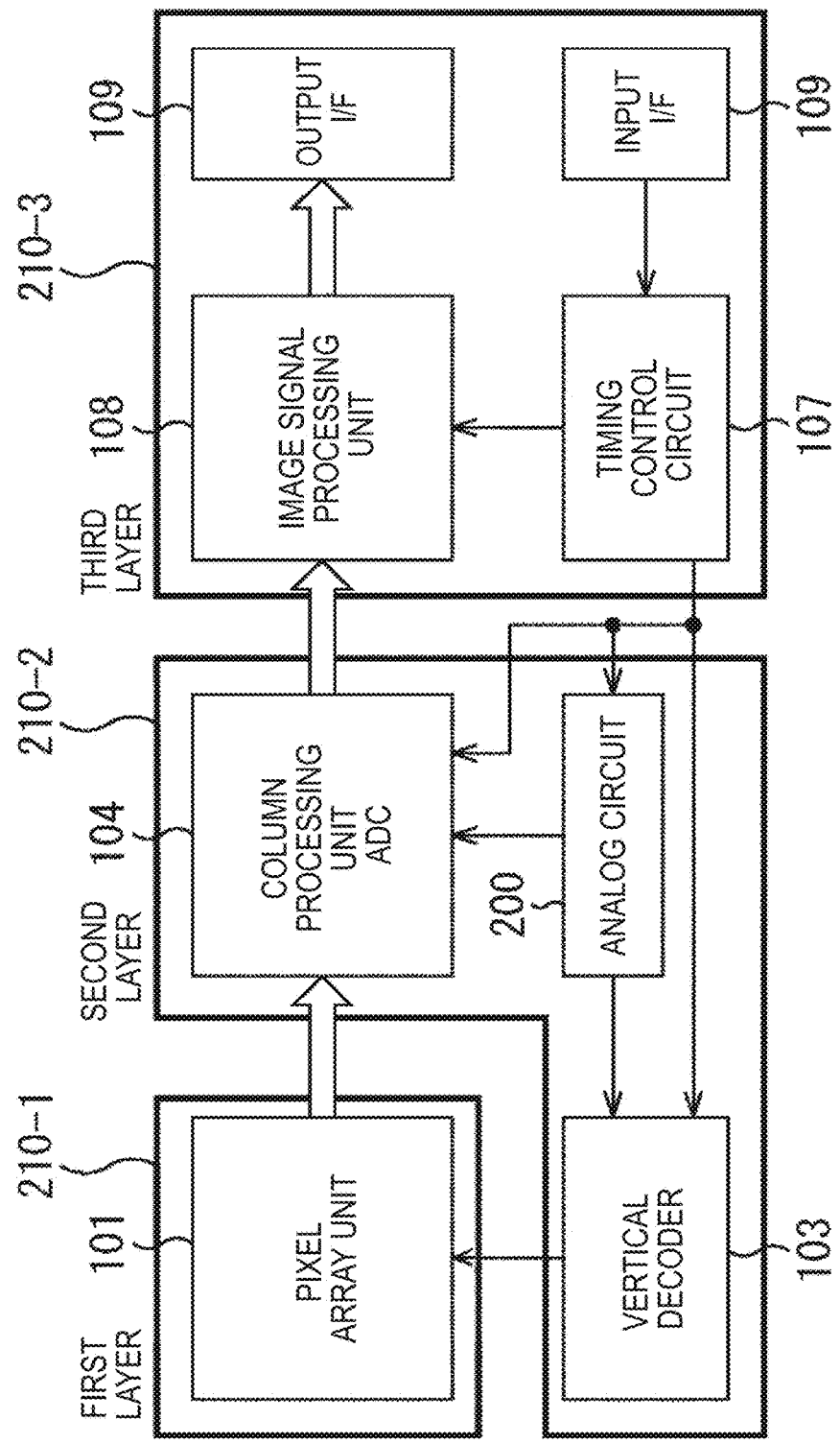
FIG. 14 is a diagram for explaining circuit arrangement of an analog circuit and a digital circuit.

In the circuit arrangement of the chip illustrated in FIG. 14, the pixel array unit 101 is disposed on the first-layer substrate 210-1. Further, the vertical decoder 103, the column processing unit 104 and the analog circuit 200 are disposed on the second-layer substrate 210-2. Further, the input I/F 109, the timing control circuit 107, the image signal processing unit 108 and the output I/F 109 are disposed on the third-layer substrate 210-3.

The vertical decoder 103, the column processing unit 104 and the analog circuit 200 disposed on the second-layer substrate 210-2 are analog circuits which mainly process analog signals. The input I/F 109, the timing control circuit 107, the image signal processing unit 108 and the output I/F disposed on the third-layer substrate 210-3 are digital circuits which mainly process digital signals.

It is also possible to dispose the circuits which process analog signals on the second-layer substrate and dispose the circuits which process digital signals on the third-layer substrate in this manner.

Figure 15:
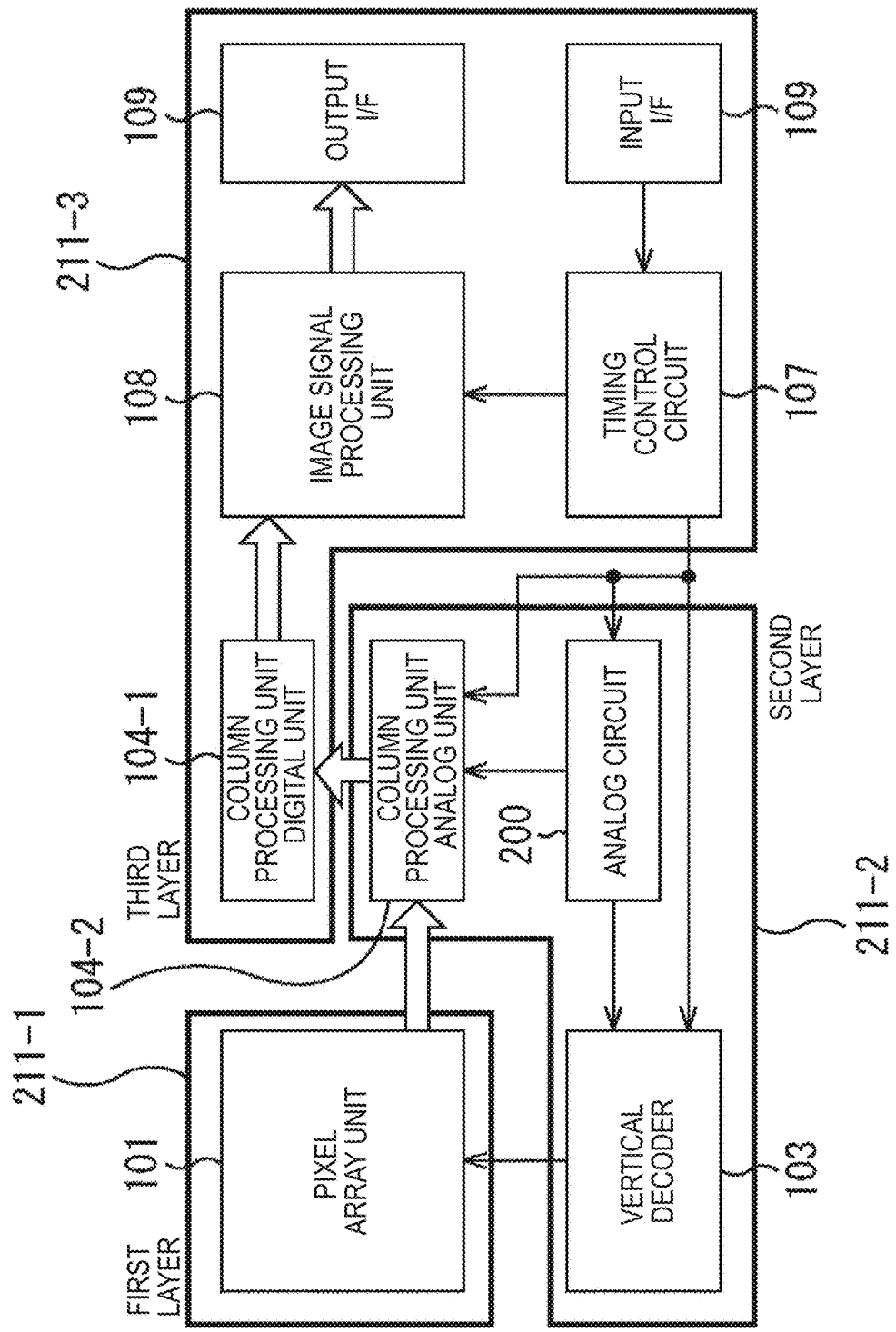
FIG. 15 is a diagram for explaining circuit arrangement of an analog circuit and a digital circuit.

Further, because analog circuits and digital circuits are mixed in the column processing unit 104, as illustrated in FIG. 15, an analog unit and a digital unit of the column processing unit 104 may be disposed on different substrates.

In the example illustrated in FIG. 15, the analog unit of the column processing unit 104 is disposed on the second-layer substrate 211-2, and the digital unit of the column processing unit 104 is disposed on the third-layer substrate 211-3. The analog unit of the column processing unit 104 is, for example, the comparator 1041 illustrated in FIG. 2, and the digital unit of the column processing unit 104 is the counter circuit 1042.

Also in the example illustrated in FIG. 15, only the pixel array unit 101 is disposed on the first-layer substrate 211-1. The vertical decoder 103, the analog circuit 200 and the column processing unit 104-1 which is the analog unit are disposed on the second-layer substrate 211-2. The input I/F 109, the timing control circuit 107, the image signal processing unit 108, the output I/F 109 and the column processing unit 104-2 which is the digital unit are disposed on the third-layer substrate 211-3.

It is also possible to divide the column processing unit 104 into the analog unit and the digital unit, dispose analog-system circuits on the second-layer substrate and dispose digital-system circuits on the third-layer substrate.

Figure 16:
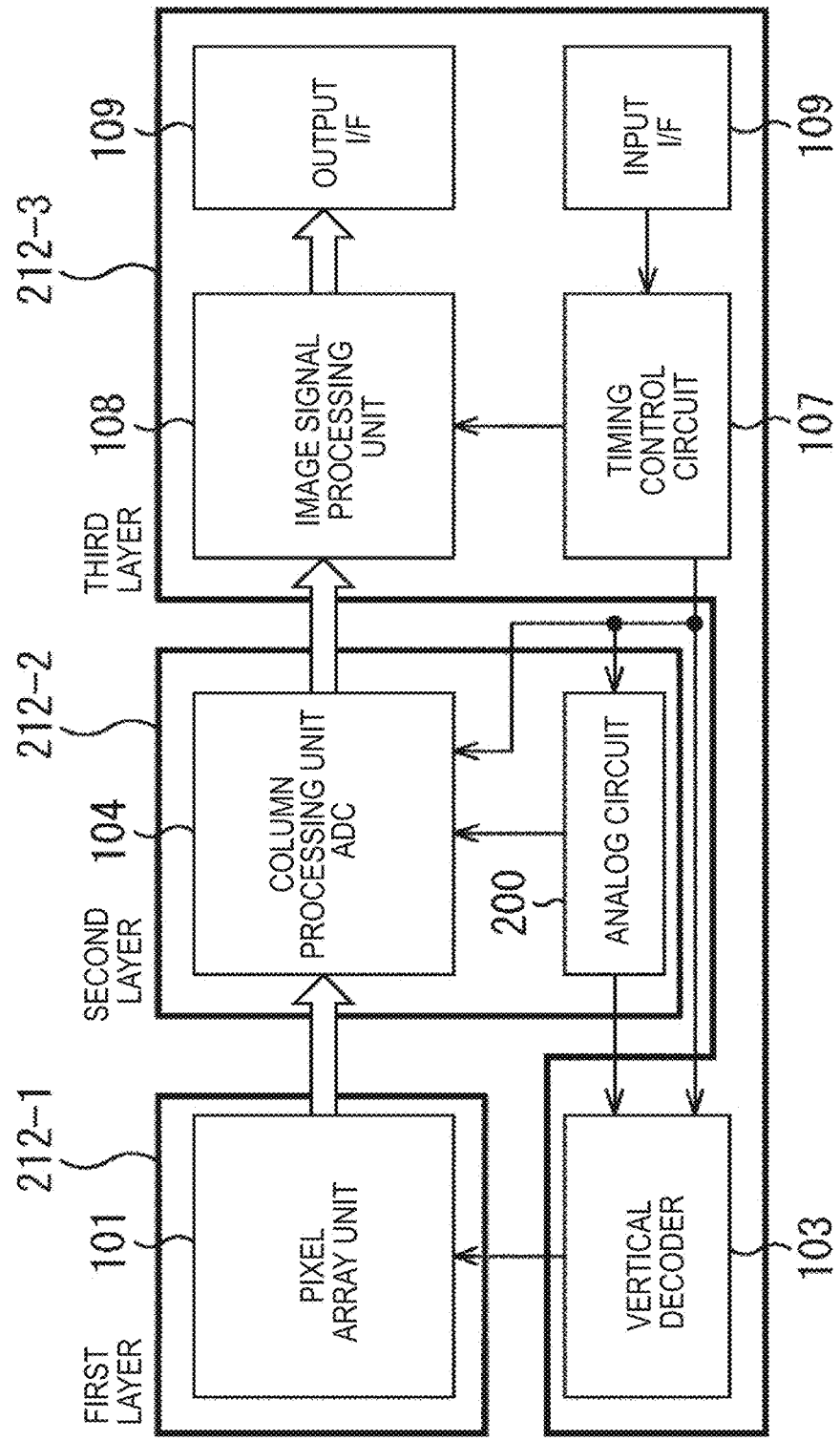
FIG. 16 is a diagram for explaining circuit arrangement of an analog circuit and a digital circuit.

Further, as illustrated in FIG. 16, it is also possible to dispose the column processing unit 104 on the second-layer substrate 212-2 and dispose other circuits on the third-layer substrate 212-3. Also in this case, only the pixel array unit 101 is disposed on the first-layer substrate 212-1.

The analog circuit 200 and the column processing unit 104 are disposed on the second-layer substrate 211-2, and the vertical decoder 103, the input I/F 109, the timing control circuit 107, the image signal processing unit 108, the output I/F 109 and the column processing unit 104-2 are disposed on the third-layer substrate 212-3.

It is also possible to mainly dispose analog-system circuits on the second-layer substrate and dispose digital-system circuits on the third-layer substrate in this manner.

Note that, here, while an example has been described where the analog-system circuits are disposed on the second-layer substrate and the digital-system circuits are disposed on the third-layer substrate, it is also possible to employ a configuration where the digital-system circuits are disposed on the second-layer substrate and the analog-system circuits are disposed on the third-layer substrate.

By employing a laminate structure by disposing the analog-system circuits and the digital-system circuits on different substrates, it is possible to make the chip of the solid-state image sensor 22 smaller, and the following advantageous effects can be expected.

First, the pixel array unit 101 can be configured with high breakdown voltage transistors (HVTr.), the analog-system circuits can be configured with high breakdown voltage transistors (HVTr.), and the digital-system circuits can be configured with low breakdown voltage transistors (LVTr).

That is, as described above, in the case of the chip having the three-layer laminate structure, it is possible to configure the first layer, the second layer and the third layer with only the high breakdown voltage transistors or the low breakdown voltage transistors.

While a fine transistor provides less effect in the analog-system circuits, it is possible to obtain benefit of high-speed and low consumption from use of a fine transistor in the digital-system circuits. However, because a fine transistor is expensive, by disposing the analog-system circuits and the digital-system circuits on different substrates, it is possible to reduce cost. Further, by disposing the digital unit and the analog unit on different substrates, it is possible to suppress noise from the substrates.

Further, there is a possibility that performance of the analog circuits varies. Therefore, it is difficult to make the transistor smaller or lower the voltage. In contrast to the analog circuits, it is relatively easy to make the digital circuits smaller and lower the voltage of the digital circuits.

From this, it is possible to make the digital circuits smaller, reduce an area for the digital circuits on the substrate and dispose the peripheral circuit 130 in a residual portion on the substrate.

By disposing a plurality of small digital circuits and analog circuits in proximity to each other, it becomes difficult to optimize a power supply voltage and pressure resistance of the transistor. However, according to the present technology, because the digital circuits and the analog circuits are disposed on different substrates, it is possible to eliminate the case where small analog circuits and digital circuits are mixed in proximity to each other.

As a result, it is possible to make the chip smaller also by eliminating a boundary region of analog and digital, and it is possible to make the chip smaller by eliminating waste such as disorder connection with different power supplies.

Application Example

An application example of a focus detecting device including the above-described phase difference detection pixel will be described below. The solid-state image sensor 22 in the above-described embodiment can be applied to an electronic apparatus in various fields, and, here, other than the imaging device (camera) illustrated in FIG. 1, an endoscope camera and a vision chip (artificial retina) will be described as one example.

Figure 17:
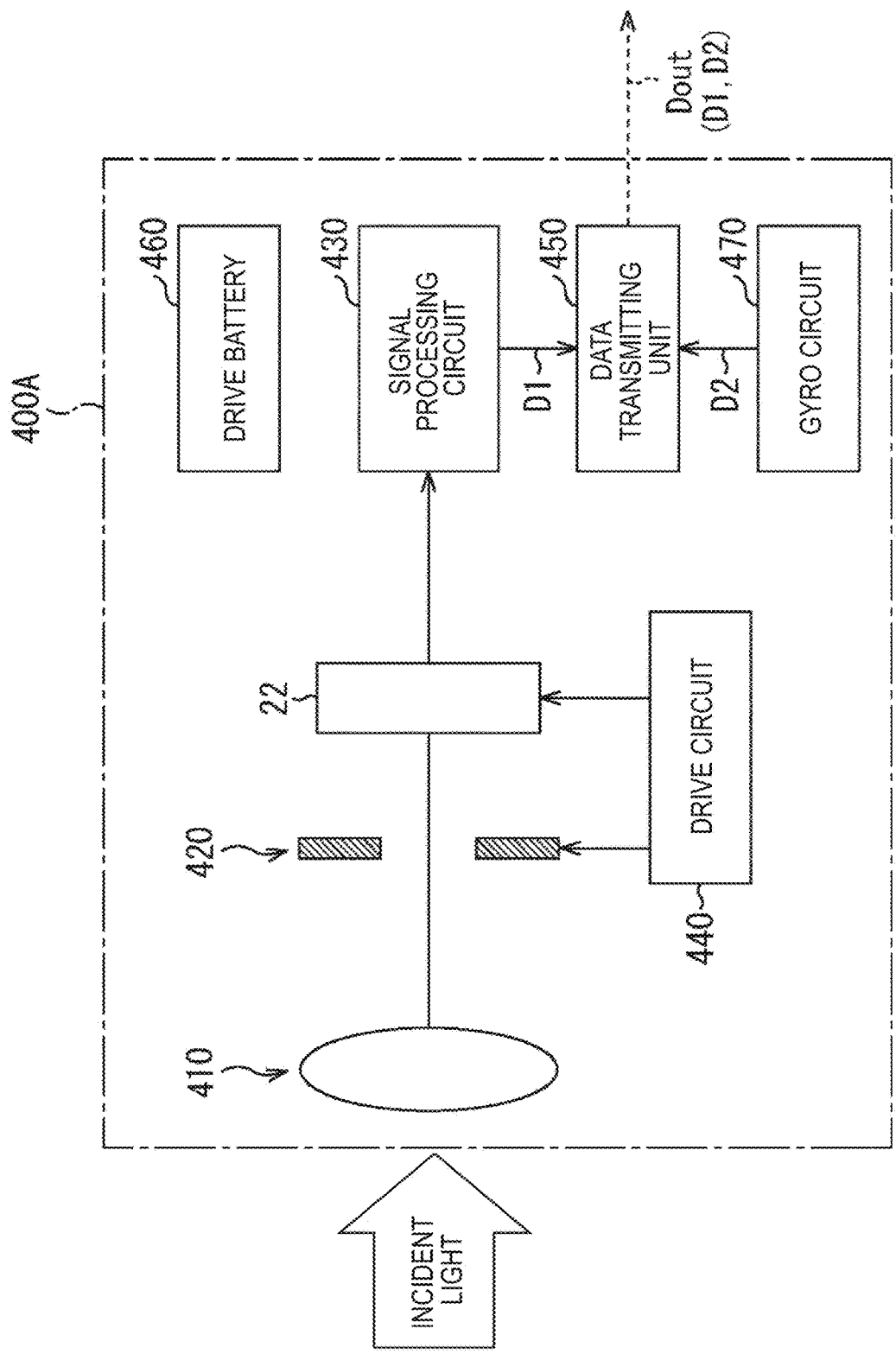
FIG. 17 is a diagram for explaining an application example of a device to which the present technology is to be applied.

FIG. 17 is a functional block diagram illustrating the whole configuration of the endoscope camera (encapsulated endoscope camera 400A) according to the application example. The encapsulated endoscope camera 400A includes an optical system 410, a shutter device 420, a solid-state image sensor 22, a drive circuit 440, a signal processing circuit 430, a data transmitting unit 450, a drive battery 460, and a posture (direction, angle) detection gyro circuit 470.

The optical system 410 includes one or a plurality of imaging lenses which form image light (incident light) from a subject on an imaging surface of the solid-state image sensor 22. The shutter device 420 controls a light illumination period (exposure period) and a light blocking period for the solid-state image sensor 22. The drive circuit 440 performs open and close drive of the shutter device 420 and drives exposure operation and signal readout operation at the solid-state image sensor 22.

The signal processing circuit 430 performs predetermined signal processing, for example, various kinds of correction processing such as demosaic processing and white balance adjustment processing on the output signal from the solid-state image sensor 22.

The optical system 410 is preferably capable of performing shooting in a plurality of directions (for example, all directions) in four dimensional space, and is configured with one or a plurality of lenses. However, in the present example, a video signal D1 after being subjected to signal processing at the signal processing circuit 430 and a posture detection signal D2 output from the gyro circuit 470 are transmitted to an external apparatus through wireless communication via the data transmitting unit 450.

Figure 18:
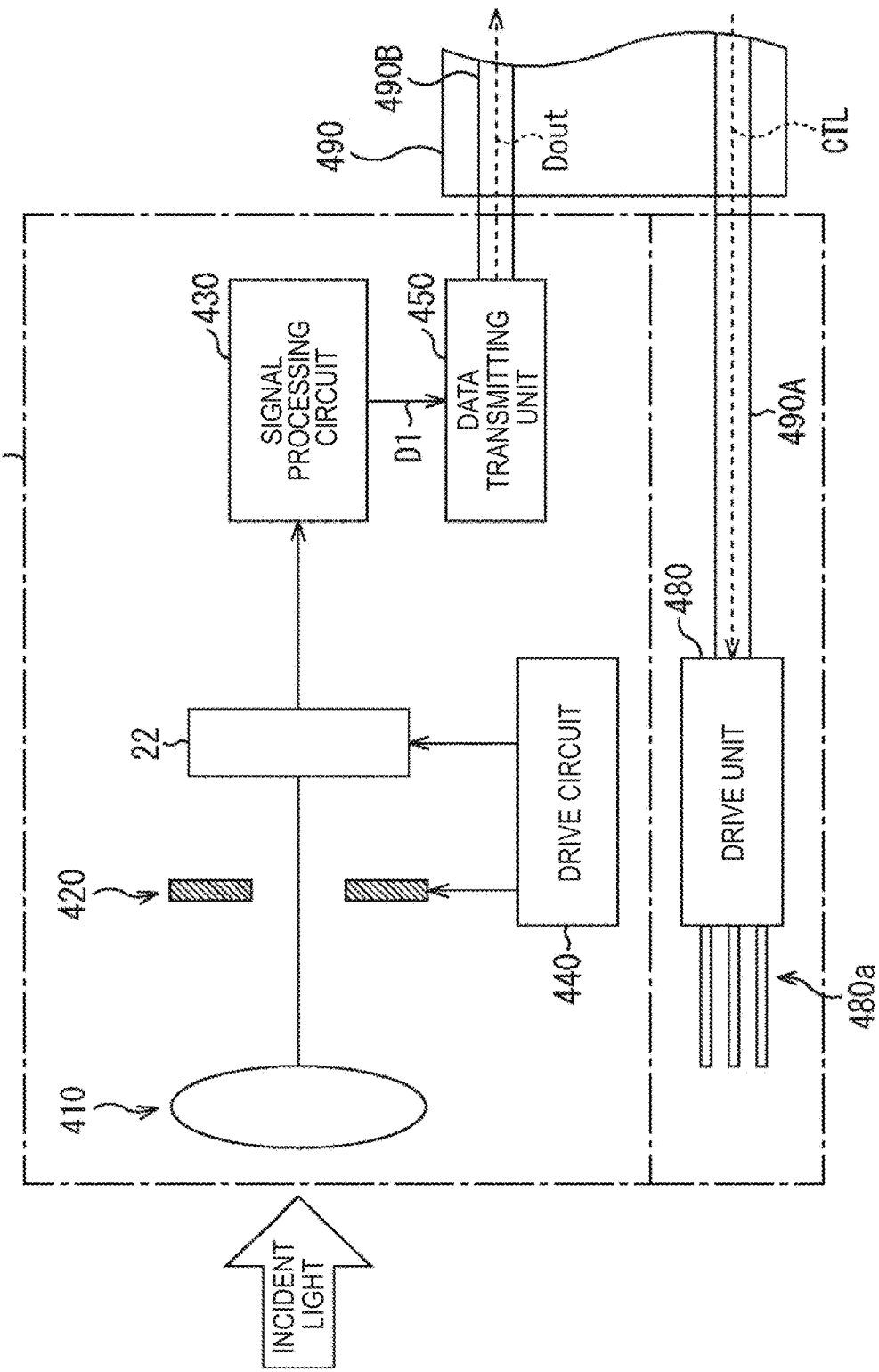
FIG. 18 is a diagram for explaining an application example of a device to which the present technology is to be applied.

Note that, the endoscope camera to which the image sensor according to the above-described embodiment can be applied is not limited to the encapsulated endoscope camera as described above, but, for example, may be an insertion type endoscope camera (insertion type endoscope camera 400B) as illustrated in FIG. 18.

As with a part of the configuration of the above-described encapsulated endoscope camera 400A, the insertion type endoscope camera 400B includes the optical system 410, the shutter device 420, the solid-state image sensor 22, the drive circuit 440, the signal processing circuit 430 and the data transmitting unit 450. However, the insertion type endoscope camera 400B further includes an arm 480a which can be stored inside the device and a drive unit 480 which drives the arm 480a. This insertion type endoscope camera 400B is connected to a cable 490 which has a wiring 490A for transmitting an arm control signal CTL to the drive unit 480 and a wiring 490B for transmitting a video signal Dout based on a shot image.

FIG. 19 is a functional block diagram illustrating the whole configuration of the vision chip (vision chip 500) according to another application example. The vision chip 500 is an artificial retina used by being embedded in part of a wall (retina E2 having optic nerves) behind an eyeball E1 of the eye. The vision chip 500 is embedded into part of one of, for example, a ganglion cell C1, a horizontal cell C2 and a photoreceptor cell C3 at the retina E2, and, for example, includes the solid-state image sensor 22, a signal processing circuit 510 and a stimulating electrode unit 520.

By this means, an electrical signal based on incident light to the eye is acquired at the solid-state image sensor 22, and the electrical signal is processed at the signal processing circuit 510, thereby a predetermined control signal is supplied to the stimulating electrode unit 520. The stimulating electrode unit 520 has a function of providing stimulus (electrical signal) to the optic nerves according to the input control signal.

The present technology can be applied to such devices.

Note that the effects described in the present specification are merely examples, and not limitative; other effects may be exhibited.

In addition, embodiments of the present disclosure are not limited to the above-described embodiment, and various alterations may occur insofar as they are within the scope of the present disclosure.

Additionally, the present technology may also be configured as below.

(1)

An image sensor including:

a pixel array unit in which pixels including photoelectric conversion elements are arranged in a two dimensional manner;

a row circuit configured to control row scanning of the pixel array unit; and a column processing unit configured to convert an analog signal read out from the pixel array unit into a digital signal, wherein the pixel array unit is disposed on a first-layer substrate, and the row circuit and the column processing unit are disposed on different substrates which are underlying layers of the first-layer substrate and which are laminated on the first-layer substrate.

(2)

The image sensor according to (1), wherein a length of the row circuit in a vertical direction is equal to or longer than a length of the pixel array unit in a vertical direction.

(3)

The image sensor according to (1) or (2), wherein a length of the column processing unit in a horizontal direction is equal to or longer than a length of the pixel array unit in a horizontal direction.

(4)

The image sensor according to any of (1) to (3), wherein, when a first substrate on which the pixel array unit is disposed and a second substrate on which the row circuit is disposed are laminated, the row circuit is disposed on the second substrate such that a central axis of the pixel array unit in a horizontal direction is displaced from a central axis of the row circuit in a horizontal direction.

(5)

The image sensor according to any of (1) to (4), wherein, when a first substrate on which the pixel array unit is disposed and a second substrate on which the column processing unit is disposed are laminated, the column processing unit is disposed on the second substrate such that a central axis of the pixel array unit in a vertical direction is displaced from a central axis of the column processing unit in a vertical direction.

(6)

The image sensor according to any of (1) to (5), wherein a memory is disposed on the same substrate as a substrate of the row circuit or the column processing unit.

(7)

An electronic apparatus including:

an image sensor including a pixel array unit in which pixels including photoelectric conversion elements are arranged in a two dimensional manner, a row circuit configured to control row scanning of the pixel array unit, and a column processing unit configured to convert an analog signal read out from the pixel array unit into a digital signal, wherein the pixel array unit is disposed on a first-layer substrate, and the row circuit and the column processing unit are disposed on different substrates which are underlying layers of the first-layer substrate and which are laminated on the first-layer substrate; and a signal processing unit configured to perform signal processing on a signal output from the image sensor.

(8)

An image sensor including:

a pixel array unit in which pixels including photoelectric conversion elements are arranged in a two dimensional manner, wherein the pixel array unit is disposed on a first-layer substrate, and a circuit which processes an analog signal and a circuit which processes a digital signal among a circuit which controls the pixel array unit and a circuit which processes a signal from the pixel array unit, are disposed on different substrates which are underlying layers of the first-layer substrate and which are laminated on the first-layer substrate.

(9)

The image sensor according to (8), wherein among a column processing unit which converts an analog signal read out from the pixel array unit into a digital signal, the circuit which processes the analog signal and the circuit which processes the digital signal are disposed on the different substrates.

(10)

The image sensor according to (8) or (9), wherein, on the first-layer substrate and a plurality of substrates which are underlying layers of the first-layer substrate, circuits configured with only low breakdown voltage transistors or high breakdown voltage transistors are disposed.

(11)

An electronic apparatus including:

an image sensor including a pixel array unit in which pixels including photoelectric conversion elements are arranged in a two dimensional manner, wherein the pixel array unit is disposed on a first-layer substrate, and a circuit which processes an analog signal and a circuit which processes a digital signal among a circuit which controls the pixel array unit and a circuit which processes a signal from the pixel array unit, are disposed on different substrates which are underlying layers of the first-layer substrate and which are laminated on the first-layer substrate; and a signal processing unit configured to perform signal processing on a signal output from the image sensor.

REFERENCE SIGNS LIST

101 pixel array unit
103 vertical decoder
104 column processing unit 130 peripheral circuit
131 row circuit
153 substrate

The invention claimed is:

1. An image sensor comprising:
a first substrate including a pixel array unit in which pixels including photoelectric conversion elements are arranged in a two dimensional manner, the pixel array unit having a first edge and a second edge that is longer than the first edge in a plan view, the first edge extending in a first direction, the second edge extending in a second direction that is perpendicular to the first direction;
a second substrate including a memory; and
a third substrate including a column processing unit, the column processing unit including a comparator and a counter, the column processing unit configured to convert an analog signal read out from the pixel array unit into a digital signal,
wherein the first substrate, the second substrate, and the third substrate are laminated,
wherein the comparator includes a first portion and a second portion,
wherein the counter includes a first portion and a second portion,
wherein, in the plan view, the first portions and the second portions are spaced apart from each other in the first direction, and
wherein the first portions and the second portions have equal lengths in the second direction and are aligned with one another in the first direction.

2. The image sensor of claim 1, wherein the first portions of the comparator and the counter are disposed adjacent to one another on a first region of the third substrate.

3. The image sensor of claim 2, wherein the second portions of the comparator and the counter are disposed adjacent to one another on a second region of the third substrate, and wherein, in the plan view, the first region and the second region are spaced apart from one another in the first direction.

4. The image sensor of claim 3, wherein the third substrate further comprises:
an image signal processing circuit disposed between the first region and the second region of the third substrate in the plan view,
wherein the lengths of the first portions and the second portions in the second direction are equal to a length of the pixel array unit in the second direction.

5. The image sensor of claim 4,
wherein, in the plan view, a length of the memory in the second direction is equal to a length of the pixel array unit in the second direction.

6. The image sensor of claim 5,
wherein, in the plan view, the memory on the second substrate overlaps the column processing unit on the third substrate, and
wherein, in the plan view, the memory on the second substrate overlaps the image signal processing circuit on the third substrate.

7. The image sensor of claim 5, wherein, in the plan view, the pixel array unit on the first substrate overlaps the memory on the second substrate.

8. The image sensor of claim 1, wherein the third substrate is between the first substrate and the second substrate.

9. The image sensor of claim 1, wherein a length of the column processing unit in the second direction is equal to or greater than a length of the pixel array unit in the second direction.

10. The image sensor of claim 1, wherein the column processing unit is disposed on the third substrate such that a central axis of the pixel array unit in the first direction is displaced from central axes of the first portions and the second portions in the first direction.

11. The image sensor of claim 10, wherein the third substrate is between the first substrate and the second substrate.

12. An electronic apparatus comprising:
an image sensor including:
a first substrate including a pixel array unit in which pixels including photoelectric conversion elements are arranged in a two dimensional manner, the pixel array unit having a first edge and a second edge that is longer than the first edge in a plan view, the first edge extending in a first direction, the second edge extending in a second direction that is perpendicular to the first direction;
a second substrate including a memory; and
a third substrate including a column processing unit, the column processing unit including a comparator and a counter, the column processing unit configured to convert an analog signal read out from the pixel array unit into a digital signal,
wherein the first substrate, the second substrate, and the third substrate are laminated,
wherein the comparator includes a first portion and a second portion,
wherein the counter includes a first portion and a second portion,
wherein, in the plan view, the first portions and the second portions are spaced apart from each other in the first direction, and
wherein the first portions and the second portions have equal lengths in the second direction and are aligned with one another in the first direction.

13. The electronic apparatus of claim 12, wherein the third substrate is between the first substrate and the second substrate.

* * * * *